United States Patent
Kasahara et al.

(10) Patent No.: US 10,544,305 B2
(45) Date of Patent: Jan. 28, 2020

(54) THERMOSETTING RESIN COMPOSITION, RESIN FILM FOR INTERLAYER INSULATION, COMPOSITE FILM, PRINTED WIRING BOARD, AND METHOD FOR PRODUCING SAME

(71) Applicant: Hitachi Chemical Company, LTD., Tokyo (JP)

(72) Inventors: Aya Kasahara, Tokyo (JP); Tetsurou Irino, Tokyo (JP); Hikari Murai, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 104 days.

(21) Appl. No.: 15/543,508

(22) PCT Filed: Dec. 3, 2015

(86) PCT No.: PCT/JP2015/084038
§ 371 (c)(1),
(2) Date: Jul. 13, 2017

(87) PCT Pub. No.: WO2016/114030
PCT Pub. Date: Jul. 21, 2016

(65) Prior Publication Data
US 2018/0327593 A1 Nov. 15, 2018

(30) Foreign Application Priority Data

Jan. 16, 2015 (JP) .................. 2015-006333

(51) Int. Cl.
*C08L 79/08* (2006.01)
*H05K 3/46* (2006.01)
*H05K 1/03* (2006.01)
*C08F 36/06* (2006.01)
*C08K 3/32* (2006.01)
*C08L 63/00* (2006.01)
*C08G 59/42* (2006.01)
*C08K 3/016* (2018.01)

(52) U.S. Cl.
CPC .......... *C08L 79/085* (2013.01); *C08F 36/06* (2013.01); *C08K 3/32* (2013.01); *C08L 63/00* (2013.01); *H05K 1/03* (2013.01); *H05K 1/0353* (2013.01); *H05K 3/46* (2013.01); *C08F 2500/02* (2013.01); *C08G 59/42* (2013.01); *C08K 3/016* (2018.01); *C08L 2203/16* (2013.01)

(58) Field of Classification Search
CPC ........ C08L 79/04; C08L 79/08; C08L 79/085; C08L 53/02; C08L 53/025; C08L 2666/54; C08L 2666/55; C08L 2666/58; C08L 2666/72; C09L 9/00
See application file for complete search history.

(56) References Cited

U.S. PATENT DOCUMENTS

| | | | | |
|---|---|---|---|---|
| 2009/0087591 A1* | 4/2009 | Larson | ................. | C09J 4/06 428/1.5 |
| 2012/0077401 A1* | 3/2012 | Kotake | .................. | B32B 27/38 442/147 |
| 2014/0199549 A1 | 7/2014 | Shin | | |

FOREIGN PATENT DOCUMENTS

| | | | | |
|---|---|---|---|---|
| CN | 1033061 A | 5/1989 | | |
| CN | 1047090 A | 11/1990 | | |
| CN | 1029981 C | 10/1995 | | |
| CN | 101849179 A | 9/2010 | | |
| CN | 102365310 A | 2/2012 | | |
| CN | 103797083 A | 5/2014 | | |
| CN | 103819870 A | 5/2014 | | |
| EP | 0390565 A2 * | 10/1990 | ............ | B32B 27/04 |
| JP | S55-73749 A | 6/1980 | | |
| JP | S56-098244 A | 8/1981 | | |
| JP | 2005-019770 A | 1/2005 | | |
| JP | 2005-039247 A | 2/2005 | | |
| JP | 2007-087982 A | 4/2007 | | |
| JP | 2009-280758 A | 12/2009 | | |
| JP | 2011-052184 A | 3/2011 | | |
| JP | 2014-024926 A | 2/2014 | | |
| JP | 2014-024936 A | 2/2014 | | |
| JP | 2014-136779 A | 7/2014 | | |
| JP | 2014-523953 A | 9/2014 | | |

OTHER PUBLICATIONS

Nisso-PB information sheet (2019) (Year: 2019).*
Translation of JP 2014-024926 (2014) (Year: 2014).*
International Search Report for PCT/JP2015/084038 dated Feb. 2, 2016; English translation submitted herewith (5 pages).

* cited by examiner

*Primary Examiner* — Robert C Boyle
(74) *Attorney, Agent, or Firm* — Fitch, Even, Tabin & Flannery, L.L.P.

(57) ABSTRACT

Provided is a thermosetting resin composition containing a polyimide compound (A) having a structural unit derived from a maleimide compound (a1) having at least two N-substituted maleimide groups and a structural unit derived from a diamine compound (a2); a modified polybutadiene (B); and an inorganic filler (C).

17 Claims, 3 Drawing Sheets

[Fig. 1]
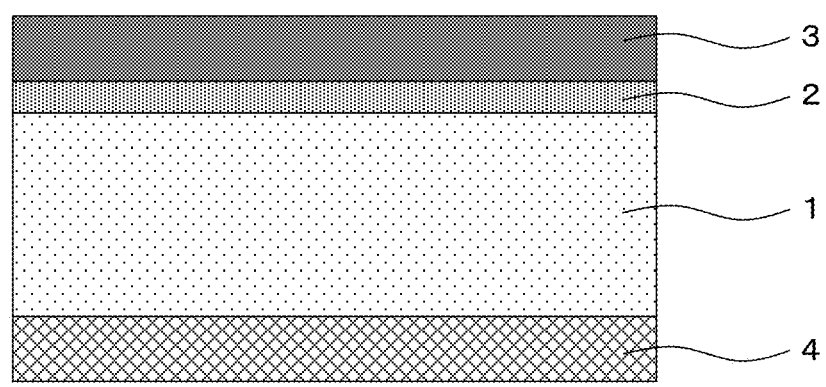

[Fig. 2]
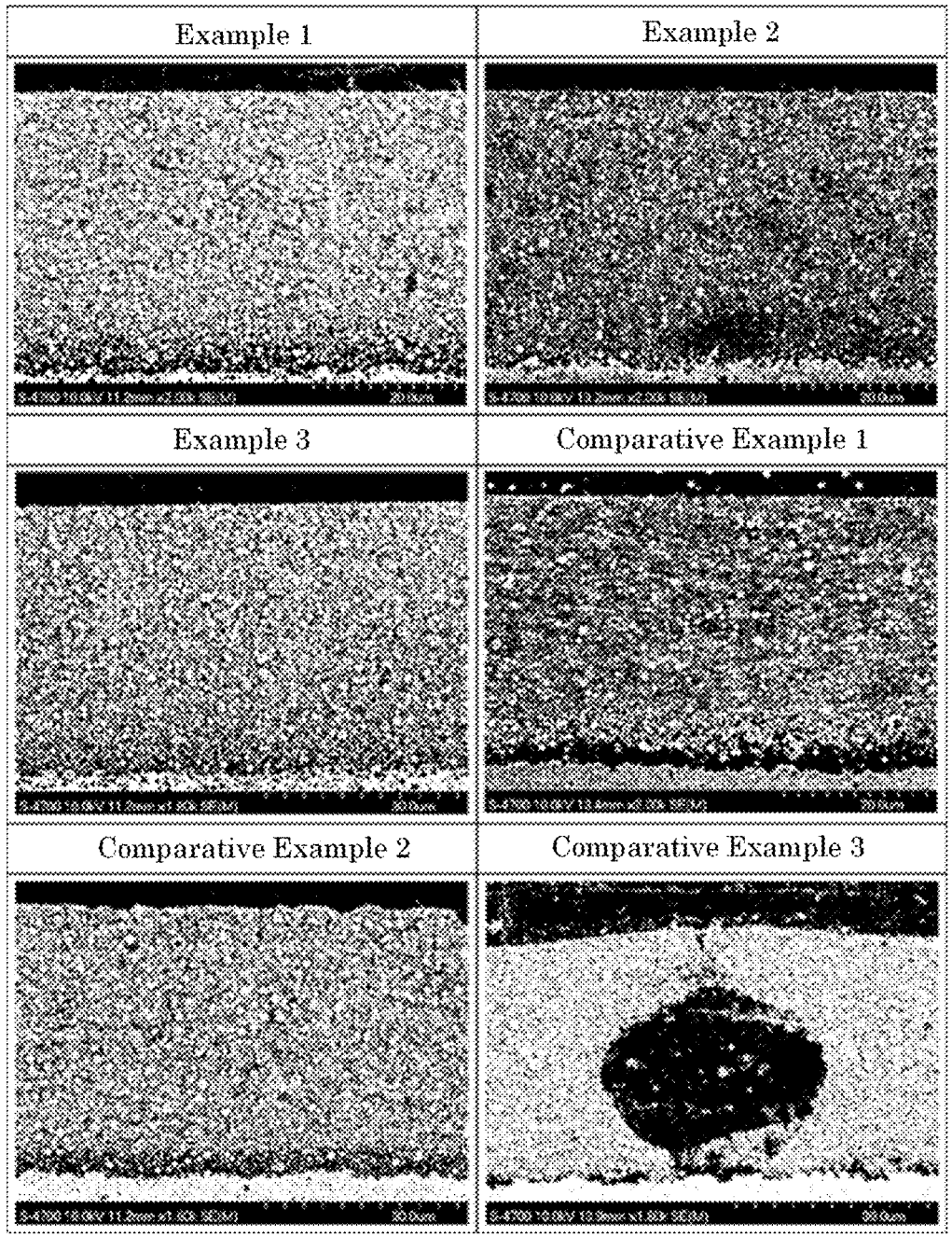

[Fig. 3]
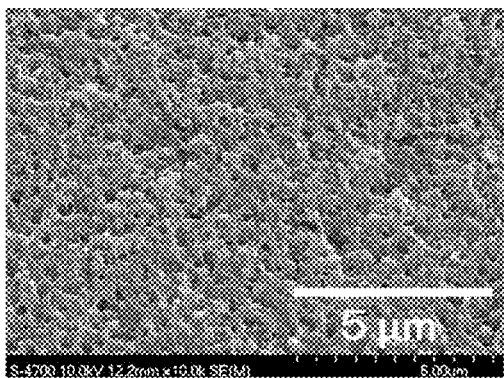 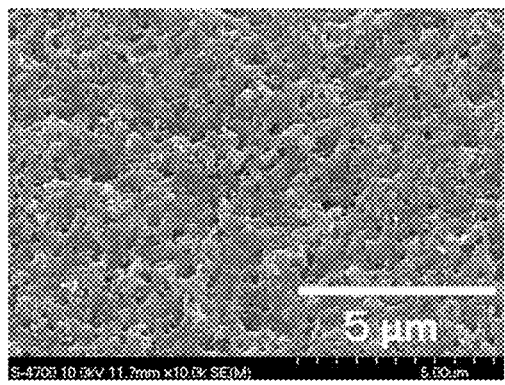
Example 5  Example 6

US 10,544,305 B2

THERMOSETTING RESIN COMPOSITION, RESIN FILM FOR INTERLAYER INSULATION, COMPOSITE FILM, PRINTED WIRING BOARD, AND METHOD FOR PRODUCING SAME

CROSS-REFERENCE TO RELATED APPLICATIONS

This application is a U.S. national phase application filed under 35 U.S.C. § 371 of International Application PCT/JP2015/084038, filed on Dec. 3, 2015, designating the United States, which claims benefit of the filing dates of JP 2015-006333, filed Jan. 16, 2015 is hereby incorporated herein by reference in its entirety.

TECHNICAL FIELD

The present invention relates to a thermosetting resin composition, a resin film for interlayer insulation, a composite film, a printed wiring board, and a method for producing same.

BACKGROUND ART

In recent years, miniaturization, weight reduction, multi-functionalization, and so on of electronic devices are much advanced. Following this, LSI (large scale integration) and high integration of chip components, etc. are advanced, and forms thereof are rapidly changed to a multi-pin or miniaturized form. For this reason, in order to improve a mounting density of electronic devices, the development of fine wiring of multi-layered printed wiring boards is advanced. As the multi-layered printed wiring boards which are in agreement with these demands, multi-layered printed wiring boards having a build-up structure using a glass cloth-free insulating resin film as an insulating layer (hereinafter also referred to as "build-up layer") in place of a prepreg are becoming the main current as a printed wiring board suited for miniaturization, weight reduction, and microfabrication.

As for the build-up layer, in order to improve the processing dimensional stability and also to reduce the amount of warpage after mounting a semiconductor, reduction in thermal expansion is demanded. As one of methods of reducing the thermal expansion of the build-up layer, a method in which a filler is highly filled is exemplified. For example, by incorporating a silica filler in an amount of 40% by mass or more in the build-up layer, it is contemplated to reduce the thermal expansion of the build-up layer (see PTLs. 1 to 3).

Meanwhile, in recent years, computers and information and communication equipment are towards high performance and high functionality more and more, and in order to process a large quantity of data at a high speed, processed signals tend to become higher in frequency. In particular, as for a frequency domain of radio waves used for mobile phones and satellite broadcasting, a high-frequency domain of a GHz band is used. In order to suppress a transmission loss to be caused due to high frequency, as organic materials to be used in a high-frequency domain, materials with low dielectric constant and dielectric tangent are desired.

In response to this, various grappling approaches have been taken. For example, PTL 4 discloses a resin composition containing a cyanate resin.

CITATION LIST

Patent Literature

PTL 1: JP 2007-87982 A
PTL 2: JP 2009-280758 A
PTL 3: JP 2005-39247 A
PTL 4: JP 2014-136779 A

SUMMARY OF INVENTION

Technical Problem

However, as a next-generation material, the demand of a material with a low dielectric tangent in a higher frequency domain than that in the resin composition disclosed in PTL 4 is increasing.

In view of the foregoing circumstances, the present invention has been made, and an object thereof is to provide a thermosetting resin composition that is low in dielectric tangent, excellent in handling properties when formed in a film, and less in resin separation and gloss unevenness of the resulting interlayer insulating layer, a resin film for interlayer insulation using same, a composite film, a printed wiring board, and a method for producing same.

Solution to Problem

In order to solve the foregoing problem, the present inventors made extensive and intensive investigations. As a result, it has been found that a thermosetting resin composition containing a specified polyimide compound (A), a specified modified polybutadiene (B), and an organic filler (C) is able to solve the foregoing problem.

Specifically, the present invention provides the following [1] to [14]

[1] A thermosetting resin composition containing a polyimide compound (A) having a structural unit derived from a maleimide compound (a1) having at least two N-substituted maleimide groups and a structural unit derived from a diamine compound (a2); a modified polybutadiene (B); and an inorganic filler (C).
[2] The thermosetting resin composition as set forth in the above [1], wherein a weight average molecular weight of the modified polybutadiene (B) is from 500 to 25,000.
[3] The thermosetting resin composition as set forth in the above [1] or [2], wherein the modified polybutadiene (B) is a polybutadiene modified with maleic anhydride.
[4] The thermosetting resin composition as set forth in the above [3], wherein the number of a maleic anhydride-derived group included in the modified polybutadiene (B) is from 1 to 10 in one molecule.
[5] The thermosetting resin composition as set forth in any of the above [1] to [4], wherein a weight average molecular weight of the polyimide compound (A) is from 800 to 1,500.
[6] The thermosetting resin composition as set forth in any of the above [1] to [5], wherein the inorganic filler (C) is silica.
[7] A resin film for interlayer insulation, including the thermosetting resin composition as set forth in any of the above [1] to [6].
[8] A composite film including a first resin layer including the thermosetting resin composition as set forth in any of the above [1] to [6]; and a second resin layer.
[9] The composite film as set forth in the above [8], wherein the second resin layer includes a second thermosetting resin composition containing a polyfunctional epoxy resin (D), an active ester curing agent (E), and a phenolic hydroxyl group-containing polybutadiene-modified polyamide resin (F).

[10] The composite film as set forth in the above [9], wherein an equivalent ratio ((ester group)/(epoxy group)) of an ester group of the active ester curing agent (E) to an epoxy group of the polyfunctional epoxy resin (D) in the second thermosetting resin composition is from 0.3 to 1.5.

[11] The composite film as set forth in the above [9] or [10], wherein the second thermosetting resin composition further contains a phosphorus-based curing accelerator (G).

[12] The composite film as set forth in any of the above [8] to [11], wherein a dielectric tangent of a cured material at 5 GHz is 0.005 or less.

[13] A printed wiring board including a cured material of the resin film for interlayer insulation as set forth in the above [7], or the composite film as set forth in any of the above [8] to [12].

[14] A method for producing a printed wiring board, including a step of laminating the resin film for interlayer insulation as set forth in the above [7], or the composite film as set forth in any of the above [8] to [12] on one surface or both surfaces of a base material.

Advantageous Effects of Invention

In accordance with the present invention, it is possible to provide a thermosetting resin composition that is low in dielectric tangent, excellent in handling properties when formed in a film, and less in resin separation and gloss unevenness of the resulting interlayer insulating layer, a resin film for interlayer insulation using same, a composite film, a printed wiring board, and a method for producing same.

BRIEF DESCRIPTION OF DRAWINGS

FIG. 1 is a schematic cross-sectional view of a composite film of the present embodiment.

FIG. 2 is a cross-sectional SEM photograph of a portion of an interlayer insulating layer of a printed wiring board obtained in each of Examples 1 to 3 and Comparative Examples 1 to 3.

FIG. 3 is a surface SEM photograph of an interlayer insulating layer of each of printed wiring boards 5B and 6B obtained in Examples 5 and 6.

DESCRIPTION OF EMBODIMENTS

Embodiments of the present invention are hereunder explained in detail. In the present specification, a numerical value range of X or more and Y or less (X and Y are each the real number) may be expressed as "X to Y". For example, a description of "0.1 to 2" denotes a numerical value range of 0.1 or more and 2 or less, and 0.1, 0.34, 1.03, 2, and the like are included in the foregoing numerical value range.

The "resin composition" as referred to in the present specification includes all of a mixture of respective components as mentioned later, a material obtained by semi-curing the foregoing mixture (in a so-called B-stage state), and a material obtained by curing the foregoing mixture (in a so-called C-stage state).

The "interlayer insulating layer" as referred to in the present specification is a layer positioning between two conductor layers and serving to insulate the conductor layers. Examples of the "interlayer insulating layer" in the present specification include a cured material of a resin film for interlayer insulation, a cured material of a composite film, and the like. The term "layer" referred to in the present specification also includes one in which a part thereof is chipped and one in which a via or pattern is formed.

[Thermosetting Resin Composition]

The thermosetting resin composition of the present embodiment (hereinafter also referred to as "first thermosetting resin composition") is one containing a polyimide compound (A) having a structural unit derived from a maleimide compound (a1) having at least two N-substituted maleimide groups and a structural unit derived from a diamine compound (a2) (hereinafter also referred to as "polyimide compound (A)" or "component (A)"); a modified polybutadiene (B) (hereinafter also referred to as "component (B)"); and an inorganic filler (C) (hereinafter also referred to as "component (C)").

<Polyimide Compound (A)>

The polyimide compound (A) is one having a structural unit derived from a maleimide compound (a1) having at least two N-substituted maleimide groups and a structural unit derived from a diamine compound (a2).

The maleimide compound (a1) having at least two N-substituted maleimide groups (hereinafter also referred to as "component (a1)") is not particularly limited so long as it is a maleimide compound having two or more N-substituted maleimide groups.

Examples of the component (a1) include bis(4-maleimidophenyl)methane, polyphenylmethane maleimide, bis(4-maleimidophenyl)ether, bis(4-maleimidophenyl)sulfone, 3,3'-dimethyl-5,5'-diethyl-4,4'-diphenylmethanebismaleimide, 4-methyl-1,3-phenylenebismaleimide, m-phenylenebismaleimide, 2,2-bis(4-(4-maleimidophenoxy)phenyl)propane, and the like. These may be used alone, or may be used in combination of two or more thereof.

The component (a1) is preferably bis(4-maleimidophenyl)methane from the standpoint that it is inexpensive; 3,3'-dimethyl-5,5'-diethyl-4,4'-diphenylmethanebismaleimide from the standpoint that it is excellent in dielectric characteristics and low in water absorptivity; and 2,2-bis(4-(4-maleimidophenoxy)phenyl)propane from the standpoint that it is excellent in mechanical characteristics, such as high adhesion to a conductor, elongation, breaking strength, etc.

Examples of the structural unit derived from the component (a1) include a group represented by the following general formula (1-1), a group represented by the following general formula (1-2), and the like.

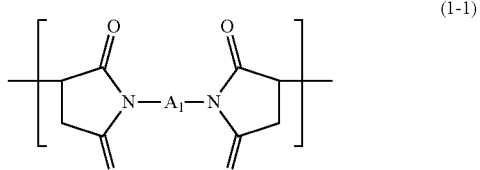

(1-1)

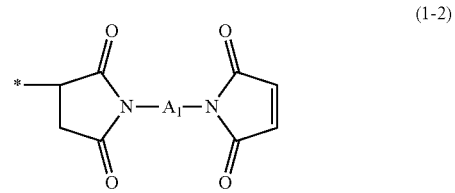

(1-2)

In the general formulae (1-1) and (1-2), $A_1$ represents a residue of the component (a1); and * represents a bonding site. Although $A_1$ is not particularly limited, for example, a residue the same as in $A_3$ as mentioned later is preferred.

The residue as referred to herein indicates a structure of a portion in which a functional group subjected to bonding (the maleimide group in the component (a1)) is eliminated from the raw material component.

A total content of the structural unit derived from the component (a1) in the polyimide compound (A) is preferably 60% by mass or more, more preferably 80% by mass or more, and still more preferably 90% by mass or more. An upper limit of the preferred content is not particularly limited, and it may be 100% by mass. When the content of the structural unit derived from the component (a1) falls within the aforementioned range, in the thermosetting resin composition of the present embodiment, there is a tendency that more excellent high frequency characteristics, heat resistance, flame retardancy, and glass transition temperature are obtained.

The diamine compound (a2) (hereinafter also referred to as "component (a2)") is not particularly limited so long as it is a compound having two amino groups.

Examples of the component (a2) include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diaminodiphenylmethane, 2,2-bis(4-aminophenyl)propane, 2,2-bis(4-(4-aminophenoxy)phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis(1-(4-(4-aminophenoxy)phenyl)-1-methylethylkenzene, 1,4-bis(1-(4-(4-aminophenoxy)phenyl)-1-methylethylkenzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)bisaniline, bis(4-(4-aminophenoxy)phenyl)sulfone, bis(4-(3-aminophenoxy)phenyl)sulfone, 9,9-bis(4-aminophenyl)fluorene, and the like. These may be used alone, or may be used in combination of two or more thereof.

The component (a2) is preferably 4,4'-diaminodiphenylmethane, 4,4'-diamino-3,3'-dimethyldiphenylmethane, 4,4'-diamino-3,3'-diethyldiphenylmethane, 2,2-bis(4-(4-aminophenoxy)phenyl)propane, 4,4'-[1,3-phenylenebis(1-methylethylidene)]bisaniline, or 4,4'[1,4-phenylenebis(1-methylethylidene)]bisaniline from the standpoint that it is excellent in solubility in an organic solvent, reactivity at the time of synthesis, and heat resistance. In addition, the component (a2) is preferably 3,3'-dimethyl-5,5'-diethyl-4,4'-diaminodiphenylmethane from the standpoint that it is excellent in dielectric characteristics and low water absorptivity. In addition, the component (a2) is preferably 2,2-bis(4-(4-aminophenoxy)phenyl)propane from the standpoint that it is excellent in mechanical characteristics, such as high adhesion to a conductor, elongation, breaking strength, etc. Furthermore, in addition to the aforementioned excellency in solubility in an organic solvent, reactivity at the time of synthesis, heat resistance, and high adhesion to a conductor, from the viewpoint that excellent high frequency characteristics and low hygroscopicity can be revealed, the component (a2) is preferably 4,4'-[1,3-phenylenebis(1-methylethylidene)]bisaniline or 4,4'[1,4-phenylenebis(1-methylethylidene)]bisaniline. These may be used alone, or may be used in combination of two or more thereof in conformity with the purpose, the application, and so on.

Examples of the structural unit derived from the component (a2) include a group represented by the following general formula (2-1), a group represented by the following general formula (2-2), and the like.

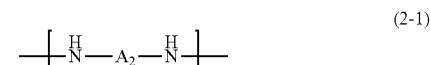
(2-1)

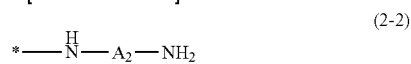
(2-2)

In the general formulae (2-1) and (2-2), $A_2$ represents a residue of the component (a2); and * represents a bonding site. Although $A_2$ is not particularly limited, for example, a residue the same as in $A_4$ as mentioned later is preferred.

A total content of the structural unit derived from the component (a2) in the polyimide compound (A) is preferably 60% by mass or more, more preferably 80% by mass or more, and still more preferably 90% by mass or more. An upper limit of the preferred content is not particularly limited, and it may be 100% by mass. When the content of the structural unit derived from the component (a2) falls within the aforementioned range, in the thermosetting resin composition of the present embodiment, there is a tendency that more excellent high frequency characteristics, heat resistance, flame retardancy, and glass transition temperature are obtained.

As for a content ratio of the structural unit derived from the component (a1) and the structural unit derived from the component (a2) in the polyimide compound (A), an equivalent ratio (Ta1/Ta2) between a total content (Ta2) of an —$NH_2$ group-derived group (—$NH_2$ is included, too) of the component (a2) and a total content (Ta1) of a maleimide group-derived group (a maleimide group is included, too) derived from the component (a1) is preferably in a range of 1.0 to 10.0, and more preferably in a range of 2.0 to 10.0. When the equivalent ratio (Ta1/Ta2) falls within the aforementioned range, in the thermosetting resin composition of the present embodiment, there is a tendency that more excellent high frequency characteristics, heat resistance, flame retardancy, and glass transition temperature are obtained.

From the standpoints of solubility in an organic solvent, high frequency characteristics, high adhesion to a conductor, moldability of a prepreg, and so on, it is preferred that the polyimide compound (A) includes a polyaminobismaleimide compound represented by the following general formula (3).

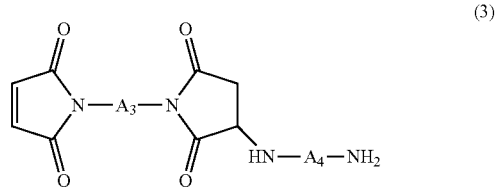
(3)

In the formula, $A_3$ is a residue represented by the following general formula (4), (5), (6), or (7); and $A_4$ is a residue represented by the following general formula (8).

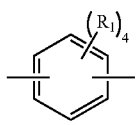 (4)

In the formula, $R_1$s each independently represent a hydrogen atom, an aliphatic hydrocarbon group having 1 to 5 carbon atoms, or a halogen atom.

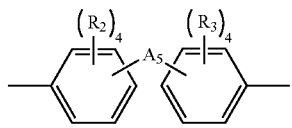 (5)

In the formula, $R_2$ and $R_3$ each independently represent a hydrogen atom, an aliphatic hydrocarbon group having 1 to 5 carbon atoms, or a halogen atom; and $A_5$ is an alkylene group or an alkylidene group each having 1 to 5 carbon atoms, an ether group, a sulfide group, a sulfonyl group, a carbo-oxy group, a ketone group, a single bond, or a residue represented by the following general formula (5-1).

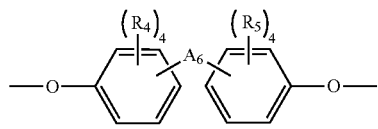 (5-1)

In the formula, $R_4$ and $R_5$ each independently represent a hydrogen atom, an aliphatic hydrocarbon group having 1 to 5 carbon atoms, or a halogen atom; and $A_6$ is an alkylene group having 1 to 5 carbon atoms, an isopropylidene group, an ether group, a sulfide group, a sulfonyl group, a carbo-oxy group, a ketone group, or a single bond.

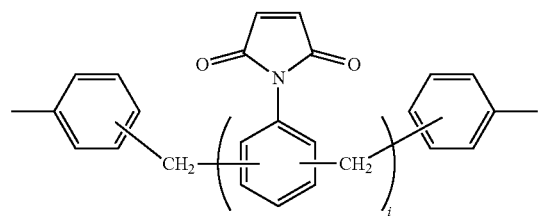 (6)

In the formula, i is an integer of 1 to 10.

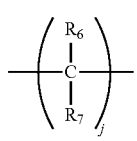 (7)

In the formula, $R_6$ and $R_7$ each independently represent a hydrogen atom or an aliphatic hydrocarbon group having 1 to 5 carbon atoms; and j is an integer of 1 to 8.

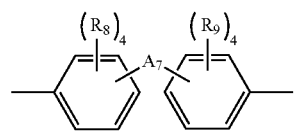 (8)

In the formula, $R_8$ and $R_9$ each independently represent a hydrogen atom, an aliphatic hydrocarbon group having 1 to 5 carbon atoms, an alkoxy group having 1 to 5 carbon atoms, a hydroxy group, or a halogen atom; and $A_7$ is an alkylene group or an alkylidene group each having 1 to 5 carbon atoms, an ether group, a sulfide group, a sulfonyl group, a carbo-oxy group, a ketone group, a fluorenylene group, a single bond, or a residue represented by the following general formula (8-1) or the following general formula (8-2).

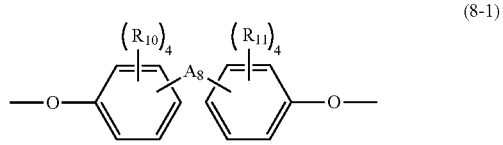 (8-1)

In the formula, $R_{10}$ and $R_{11}$ each independently represent a hydrogen atom, an aliphatic hydrocarbon group having 1 to 5 carbon atoms, or a halogen atom; and $A_8$ is an alkylene group having 1 to 5 carbon atoms, an isopropylidene group, a m- or p-phenylenediisopropylidene group, an ether group, a sulfide group, a sulfonyl group, a carbo-oxy group, a ketone group, or a single bond.

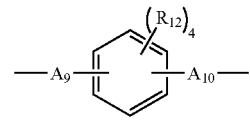 (8-2)

In the formula, $R_{12}$s each independently represent a hydrogen atom, an aliphatic hydrocarbon group having 1 to 5 carbon atoms, or a halogen atom; and $A_9$ and $A_{10}$ are each an alkylene group having 1 to 5 carbon atoms, an isopropylidene group, an ether group, a sulfide group, a sulfonyl group, a carbo-oxy group, a ketone group, or a single bond.

The polyimide compound (A) can be, for example, produced by allowing the component (a1) and the component (a2) to react with each other in an organic solvent.

The organic solvent which is used on the occasion of producing the polyimide compound (A) is not particularly limited, and a known solvent can be used. The organic solvent may be an organic solvent which is used for the production of a varnish for resin film for interlayer insulation as mentioned later.

As for use amounts of the component (a1) and the component (a2) on the occasion of producing the polyimide compound (A), the component (a1) and the component (a2) are blended such that an equivalent ratio (Ta1'/Ta2') between an —$NH_2$ group equivalent (Ta2') of the component (a2) and a maleimide group equivalent (Ta1') of the component (a1) is preferably in a range of 1.0 to 10.0, and more preferably in a range of 2.0 to 10.0. When the component (a1) and the component (a2) are blended within the aforementioned range, in the thermosetting resin composition of the present embodiment, there is a tendency that more excellent high frequency characteristics, heat resistance, flame retardancy, and glass transition temperature are obtained.

On the occasion of allowing the component (a1) and the component (a2) to react with each other to produce the polyimide compound (A), a reaction catalyst can also be used as the need arises. Although the reaction catalyst is not particularly limited, examples thereof include acidic catalysts, such as p-toluenesulfonic acid, etc.; amines, such as triethylamine, pyridine, tributylamine, etc.; imidazoles, such as methyl imidazole, phenyl imidazole, etc.; phosphorus-based catalysts, such as triphenylphosphine, etc.; and the like. These may be used alone or in combination of two or more thereof. In addition, though a blending amount of the reaction catalyst is not particularly limited, for example, the reaction catalyst can be used in an amount ranging from 0.01 to 5.0 parts by mass based on 100 parts by mass of the total amount of the component (a1) and the component (a2).

The polyimide compound (A) is obtained by charging prescribed amounts of the component (a1) and the component (a2) and optionally, other component in a synthesis kettle and subjecting the component (a1) and the component (a2) to the Michael addition reaction. Although the reaction condition in this step is not particularly limited, for example, from the viewpoints of workability, such as a reaction rate, etc., gelation suppression, and so on, a reaction temperature is preferably 50 to 160° C., and a reaction time is preferably 1 to 10 hours.

In this step, a solid content concentration of the reaction raw material and a solution viscosity can be regulated by addition of the aforementioned organic solvent or concentration. Although the solid content concentration of the reaction raw materials is not particularly limited, for example, it is preferably 10 to 90% by mass, and more preferably 20 to 80% by mass. In the case where the solid content concentration of the reaction raw materials is 10% by mass or more, the reaction rate does not become excessively slow, so that such is advantageous from the standpoint of production costs. In addition, in the case where the solid content concentration of the reaction raw materials is 90% by mass or less, more excellent solubility is obtained, stirring efficiency is excellent, and gelation is scarcely caused.

After producing the polyimide compound (A), concentration may be performed by removing a part or the whole of the organic solvent, or dilution may be performed by adding an organic solvent, in conformity with the purpose. As the organic solvent which is additionally used, the organic solvents exemplified in the production step of the polyimide compound (A) are applicable. These may be used alone, or may be used in admixture of two or more thereof. In addition, from the viewpoint of solubility, the organic solvent which is used is preferably methyl ethyl ketone, cyclohexanone, propylene glycol monomethyl ether, N,N-dimethylformamide, or N,N-dimethylacetamide.

Although a weight average molecular weight of the polyimide compound (A) is not particularly limited, for example, it is preferably in a range of 800 to 1,500, more preferably in a range of 800 to 1,300, and still more preferably in a range of 800 to 1,100. The weight average molecular weight of the polyimide compound (A) can be determined by the method described in the Examples.

Although the content of the polyimide compound (A) in the thermosetting resin composition of the present embodiment is not particularly limited, it is preferably 50 to 95% by mass, more preferably 60 to 90% by mass, and still more preferably 70 to 85% by mass in a total mass of all of the resin components contained in the thermosetting resin composition of the present embodiment. When the content of the polyimide compound (A) falls within the aforementioned range, there is a tendency that the dielectric tangent becomes lower.

<Modified Polybutadiene (B)>

In the present embodiment, the modified polybutadiene (B) is not particularly limited so long as it is a chemically modified polybutadiene. When the modified polybutadiene (B) is used, in the resulting interlayer insulating layer, separation between the inorganic filler (C) and the resin components, gloss unevenness, and so on can be reduced. The chemically modified polybutadiene as referred to in the present specification indicates one in which the 1,2-vinyl group of the side chain and/or both or one of the ends in the molecule is chemically modified by means of acid anhydration, epoxidation, glycolation, phenolation, maleination, (meth)acrylation, urethanation, or the like.

The modified polybutadiene (B) is preferably one containing a 1,2-butadiene unit having a 1,2-vinyl group in the side chain in the molecule, and more preferably one containing 40% by mass or more of the 1,2-butadiene unit.

From the viewpoint of obtaining a thermosetting resin composition with a lower dielectric tangent, the modified polybutadiene (B) is preferably a polybutadiene modified with an acid anhydride. Although the acid anhydride is not limited, examples thereof include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride, methyltetrahydrophthalic anhydride, and the like. The acid anhydride is preferably any of phthalic anhydride, maleic anhydride, trimellitic anhydride, pyromellitic anhydride, hexahydrophthalic anhydride, or tetrahydrophthalic anhydride, and more preferably maleic anhydride.

In the case where the modified polybutadiene (B) is a polybutadiene modified with an acid anhydride, the number of an acid anhydride-derived group contained in one molecule of the modified polybutadiene (B) (hereinafter also referred to as "acid anhydride group") is preferably 1 to 10, more preferably 1 to 6, and still more preferably 2 to 5. When the number of the acid anhydride group is 1 or more in one molecule, there is a tendency that the separation between the inorganic filler (C) and the resin components on the occasion of forming the interlayer insulating layer is more suppressed. In addition, when the number of the acid anhydride group is 10 or less in one molecule, there is a tendency that the dielectric tangent of the resulting thermosetting resin composition becomes lower.

That is, in the case where the modified polybutadiene (B) is a polybutadiene modified with maleic anhydride, from the same viewpoint as mentioned above, the number of a maleic anhydride-derived group contained in one molecule of the modified polybutadiene (B) (hereinafter also referred to as "maleic anhydride group") is preferably 1 to 10, more preferably 1 to 6, and still more preferably 2 to 5.

A weight average molecular weight of the modified polybutadiene (B) is preferably 500 to 25,000, more preferably 1,000 to 20,000, still more preferably 2,000 to 13,000, and especially preferably 3,000 to 10,000. In the case where the weight average molecular weight of the modified polybutadiene (B) is 500 or more, there is a tendency that the curing properties of the resulting thermosetting resin composition and the dielectric characteristics when formed into a cured material become more excellent.

In addition, in the case where the weight average molecular weight of the modified polybutadiene (B) is 25,000 or less, in the resulting interlayer insulating layer, there is a tendency that the separation between the inorganic filler (C) and the resin components and the gloss unevenness are more suppressed. As for the weight average molecular weight of the modified polybutadiene (B), the measurement method of the weight average molecular weight of the polyimide compound (A) in the Examples of the present specification can be applied.

As the modified polybutadiene (B) which is used in the present embodiment, a commercially available product may be used. Examples of the modified polybutadiene (B) as the commercially available product include Ricon 130MA8, Ricon 131MA5, and Ricon 184MA6 (trade names, manufactured by Cray Valley); POLYVEST MA75 and POLYVEST EP MA120 (trade names, manufactured by Evonik); and the like.

Although the content of the modified polybutadiene (B) in the thermosetting resin composition of the present embodiment is not particularly limited, it is preferably 1 to 50% by mass, more preferably 5 to 40% by mass, and still more preferably 10 to 30% by mass in a total mass of all of the resin components contained in the thermosetting resin composition of the present embodiment. When the content of the modified polybutadiene (B) falls within the aforementioned range, there is a tendency that the resin separation and the gloss unevenness can be more minimized.

Although a total content of the polyimide compound (A) and the modified polybutadiene (B) in the thermosetting resin composition of the present embodiment is not particularly limited, it is preferably 80% by mass or more, more preferably 85% by mass or more, and still more preferably 90% by mass or more in a total mass of all of the resin components contained in the thermosetting resin composition of the present embodiment. An upper limit of the content is not particularly limited, and it may be 100%.

Although a total content of the polyimide compound (A) and the modified polybutadiene (B) in the thermosetting resin composition of the present embodiment is not particularly limited, it is preferably 20 to 90% by mass, more preferably 30 to 80% by mass, and still more preferably 35 to 70% by mass in a total mass of the thermosetting resin composition of the present embodiment.

<Inorganic Filler (C)>

The inorganic filler (C) is not particularly limited, and examples thereof include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, calcium zirconate, and the like. From the viewpoint of enabling the resulting interlayer insulating layer to have lower thermal expansion, the component (C) is preferably silica.

Although a volume average particle diameter of the component (C) is not particularly limited, for example, it is preferably 0.05 to 5 μm, more preferably 0.1 to 3 μm, and still more preferably 0.2 to 1 μm. When the volume average particle diameter of the component (C) is 5 μm or less, there is a tendency that on the occasion of forming a circuit pattern on the interlayer insulating layer, the formation of a fine pattern may be more stably performed. In addition, when the volume average particle diameter of the component (C) is 0.1 μm or more, there is a tendency that the heat resistance becomes more excellent. The volume average particle diameter as referred to herein indicates a particle diameter at a point corresponding to 50% when a total volume of the particles is defined as 100%, and a cumulative frequency distribution curve by the particle diameter is determined, and it can be measured by a particle size distribution measurement device adopting the laser diffraction scattering method, or the like.

For the purpose of improving the dispersibility of the component (C) and the adhesion between the component (C) and the organic components in the thermosetting resin composition, a coupling agent may be used in combination as the need arises. The coupling agent is not particularly limited, and for examples, various silane coupling agents and titanate coupling agents, and the like can be used. These may be used alone, or may be used in combination of two or more thereof. In addition, the use amount thereof is not particularly limited, and for example, it is preferably 0.1 to 5 parts by mass, and more preferably 0.5 to 3 parts by mass based on 100 parts by mass of the component (C) used. When the use amount of the coupling agent falls within this range, advantages to be brought due to the use can be more effectively exhibited.

In the case of using a coupling agent, its addition system may be a so-called integral blending treatment system in which the component (C) is blended in the thermosetting resin composition of the present embodiment, and the coupling agent is then added. However, from the viewpoint of more effectively revealing the advantages of the component (C), the addition system may also be a system of using an inorganic filler obtained by previously subjecting the inorganic filler to a surface treatment with the coupling agent in a dry or wet mode.

From the viewpoint of dispersibility of the component (C) in the thermosetting resin composition, it is preferred to use a slurry prepared by previously dispersing the component (C) in an organic solvent as the need arises. Although the organic solvent which is used on the occasion of forming the component (C) in a slurry is not particularly limited, for example, the organic solvents exemplified above in the production step of the polyimide compound (A) are applicable. These may be used alone, or may be used in admixture of two or more thereof. In addition, from the viewpoint of higher dispersibility, among these organic solvents, methyl ethyl ketone, methyl isobutyl ketone, and cyclohexanone are preferred.

Although a non-volatile component concentration of the slurry of the component (C) is not particularly limited, for example, from the viewpoints of settleability and dispersibility of the inorganic filler (C), it is preferably 50 to 80% by mass, and more preferably 60 to 80% by mass.

The content of the component (C) is, for example, preferably 40 to 300 parts by mass, more preferably 60 to 200 parts by mass, and still more preferably 80 to 150 parts by mass based on 100 parts by mass as expressed in terms of the solid content of the resin components of the thermosetting resin composition.

The thermosetting resin composition of the present embodiment may contain a flame retardant, a curing accelerator, and so on as the need arises.

When the thermosetting resin composition of the present embodiment contains a flame retardant, more excellent flame retardancy can be imparted. The flame retardant is not particularly limited, and examples thereof include a chlorine-based flame retardant, a bromine-based flame retardant, a phosphorus-based flame retardant, a metal hydrate-based flame retardant, and the like. From the standpoint of compatibility with the environment, a phosphorus-based flame retardant or a metal hydrate-based flame retardant is preferred.

When the thermosetting resin composition of the present embodiment contains an appropriate curing accelerator, the curability of the thermosetting resin composition is improved, whereby the dielectric characteristics, heat resistance, high modulus, glass transition temperature, and so on of the interlayer insulating layer can be more improved. The curing accelerator is not particularly limited, and examples thereof include various imidazole compounds and derivatives thereof various tertiary amine compounds; various quaternary ammonium compounds; various phosphorus-based compounds, such as triphenylphosphine, etc.; and the like.

The thermosetting resin composition of the present embodiment may contain, in addition to those described above, additives, such as an antioxidant, a fluidity controlling agent, etc.

[Resin Film for Interlayer Insulation]

The resin film for interlayer insulation of the present embodiment is one including the first thermosetting resin composition.

The resin film for interlayer insulation of the present embodiment may also be one in which a support is provided on either one surface thereof.

Examples of the support include films of polyolefins, such as polyethylene, polypropylene, polyvinyl chloride, etc.; films of polyesters, such as polyethylene terephthalate (hereinafter also referred to as "PET"), polyethylene naphthalate, etc.; various plastic films, such as a polycarbonate film, a polyimide film, etc.; and the like. In addition, a metal foil, such as a copper foil, an aluminum foil, etc., a release paper, and so on may also be used. The support and a protective film as mentioned later may be ones having been subjected to a surface treatment, such as a matting treatment, a corona treatment, etc. In addition, the support and a protective film as mentioned later may also be ones having been subjected to a release treatment with a silicone resin-based release agent, an alkyd resin-based release agent, a fluorine resin-based release agent, or the like.

Although the thickness of the support is not particularly limited, it is preferably 10 to 150 μm, and more preferably 25 to 50 μm.

<Production Method of Resin Film for Interlayer Insulation>

The resin film for interlayer insulation of the present embodiment can be, for example, produced in the following manner.

First of all, it is preferred that the component (A), the component (B), and the component (C), and optionally used other components are dissolved or dispersed in an organic solvent to prepare a resin varnish (hereinafter also referred to as "varnish for resin film for interlayer insulation").

Examples of the organic solvent which is used for producing a varnish for resin film for interlayer insulation may include ketones, such as acetone, methyl ethyl ketone, methyl isobutyl ketone, cyclohexanone, etc.; acetic acid esters, such as ethyl acetate, butyl acetate, cellosolve acetate, propylene glycol monomethyl ether, carbitol acetate, etc.; carbitols, such as cellosolve, butyl carbitol, etc.; aromatic hydrocarbons, such as toluene, xylene, etc.; amide-based solvents, such as dimethylformamide, dimethylacetamide, N-methylpyrrolidone, etc.; and the like. These organic solvents may be used alone, or may be used in combination of two or more thereof.

A blending amount of the organic solvent is preferably 10 to 60 parts by mass, and more preferably 10 to 35 parts by mass based on 100 parts by mass of a total mass of the varnish for resin film for interlayer insulation.

The resin film for interlayer insulation is obtained by coating the varnish for resin film for interlayer insulation on the support, followed by heating for drying.

As for a method of coating the varnish for resin film for interlayer insulation on the support, a coating device, such as a comma coater, a bar coater, a kiss coater, a roll coater, a gravure coater, a die coater, etc., can be used. It is preferred that such a coating device is properly selected according to the film thickness.

Although a drying condition after coating is not particularly limited, for example, in the case of a varnish for resin film for interlayer insulation containing 30 to 60% by mass of an organic solvent, the resin film for interlayer insulation can be suitably formed by drying at 50 to 150° C. for approximately 3 to 10 minutes. The varnish is dried in such a manner that the content of a volatile component (mainly the organic solvent) in the resin film for interlayer insulation after drying is preferably 10% by mass or less, and more preferably 6% by mass or less.

In the case of using the resin film for interlayer insulation of the present embodiment when disposed on a conductor layer, from the viewpoint of embedding the conductor layer of a circuit board, its thickness is preferably the thickness of the conductor layer of the circuit board or more. Specifically, since the thickness of the conductor layer which the circuit board has is typically in a range of 5 to 70 μm, the thickness of the resin film for interlayer insulation is preferably 5 to 100 μm.

A protective film may be provided on a surface of the resin film for interlayer insulation formed on the support, on the side opposite to the support. Although the thickness of the protective film is not particularly limited, for example, it is 1 to 40 μm. By laminating the protective film, attachment of a dust, etc. and scratch on the surface of the resin film for interlayer insulation can be prevented from occurring. The resin film for interlayer insulation can be stored upon being wound up in a roll state.

[Composite Film]

The composite film of the present embodiment is a composite film including a first resin layer including the thermosetting resin composition of the present embodiment and a second resin layer. That is, it is preferred that the composite film of the present embodiment contains the first thermosetting resin composition and a second thermosetting resin composition as mentioned later.

An example of the composite film of the present embodiment is shown as a schematic cross-sectional view in FIG. 1. The composite film according to the present embodiment includes a first resin layer 1 and a second resin layer 2 and optionally, a support 3 and/or a protective film 4.

A distinct interface does not exist between the first resin layer and the second insulating layer, and for example, a part of the constituent components of the first resin layer and a part of the constituent components of the second insulating layer may be present in a compatibilized and/or mixed state.

<First Resin Layer>

The first resin layer is one including the first thermosetting resin composition of the present embodiment. For example, in the case of producing a printed wiring board using the composite film of the present embodiment, the first resin layer is provided between a circuit board and an adhesive auxiliary layer and used for the purpose of insulating a conductor layer of the circuit board from a layer provided thereon. In addition, in the case where a through-hole, a via hole, or the like is present in the circuit board, the first resin layer flows thereinto, to play a role for filling the inside of the hole.

<Second Resin Layer>

In a printed wiring board of the present embodiment as mentioned later, the second resin layer is positioned between a cured material of the first resin layer including the thermosetting resin composition of the present embodiment and a conductor layer and provided for the purpose of improving the adhesion to the conductor layer. By providing the second resin layer, not only a smooth surface is obtained, but also a more excellent adhesive strength to the conductor layer formed by plating is obtained. In consequence, from the viewpoint of forming a fine wiring, it is preferred to provide the second resin layer.

The second resin layer is not particularly limited so long as it improves the adhesion to the conductor layer. However, for example, even if the surface roughness is small, from the viewpoint of obtaining an interlayer insulating layer that is not only excellent in adhesion to plated copper but also low in dielectric tangent, it is preferred that the second resin layer includes a second thermosetting resin composition containing a polyfunctional epoxy resin (D) (hereinafter also referred to as "component (D)"), an active ester curing agent (E) (hereinafter also referred to as "component (E)"), and a phenolic hydroxyl group-containing polybutadiene-modified polyamide resin (F) (hereinafter also referred to as "component (F)").

<Polyfunctional Epoxy Resin (D)>

Although the polyfunctional epoxy resin (D) is not particularly limited so long as it is a resin having two or more epoxy groups, examples thereof include a bisphenol A type epoxy resin, a bisphenol F type epoxy resin, a bisphenol S type epoxy resin, a cresol novolak type epoxy resin, a phenol novolak type epoxy resin, a biphenyl type epoxy resin, a naphthol type epoxy resin, an anthracene type epoxy resin, a dicyclopentadiene type epoxy resin, a naphthalene type epoxy resin, an aralkyl novolak type epoxy resin, a fluorene type epoxy resin, a xanthene type epoxy resin, and the like. From the viewpoint of adhesion to the plated copper, an epoxy resin having a biphenyl structure is preferred, and a polyfunctional epoxy resin having a biphenyl structure or an aralkyl novolak type epoxy resin having a biphenyl structure is more preferred.

As the polyfunctional epoxy resin (D), a commercially available product may be used. Examples of the commercially available product include "NC-3000H", "NC-3000L", "NC-3100", and "NC-3000" (aralkyl novolak type epoxy resins having a biphenyl structure), all of which are manufactured by Nippon Kayaku Co., Ltd., and the like.

Although an epoxy equivalent of the polyfunctional epoxy resin (D) is not particularly limited, from the viewpoint of adhesion, it is preferably 150 to 450 g/mol, more preferably 200 to 400 g/mol, and still more preferably 250 to 350 g/mol.

The polyfunctional epoxy resin (D) may be used alone, or may be used in combination of two or more thereof.

Although the content of the polyfunctional epoxy resin (D) in the second thermosetting resin composition is not particularly limited, it is preferably 10 to 90 parts by mass, more preferably 20 to 70 parts by mass, and still more preferably 30 to 60 parts by mass based on 100 parts by mass of the solid content included in the second thermosetting resin composition. When the content of the polyfunctional epoxy resin (D) is 10 parts by mass or more, a more excellent adhesive strength to the plated copper is obtained, whereas when it is 90 parts by mass or less, there is a tendency that a lower dielectric tangent is obtained.

In the present specification, the solid content included in the resin composition means a residue resulting from removal of the volatile component from the components constituting the resin composition.

<Active Ester Curing Agent (E)>

The active ester curing agent (E) refers to one having one or more ester groups in one molecule and having a curing action of the epoxy resin.

Although the active ester curing agent (E) is not particularly limited, examples thereof include ester compounds obtained from an aliphatic or aromatic carboxylic acid and an aliphatic or aromatic hydroxy compound; and the like.

Among them, as for an ester compound obtained from an aliphatic carboxylic acid, an aliphatic hydroxy compound, and so on, in view of the fact that it includes an aliphatic chain, there is a tendency that solubility in an organic solvent and compatibility with the epoxy resin can be enhanced.

As for an ester compound obtained from an aromatic carboxylic acid, an aromatic hydroxy compound, and so on, in view of the fact that it has an aromatic ring, there is a tendency that the heat resistance may be enhanced.

Examples of the active ester curing agent (E) include a phenol ester compound, a thiophenol ester compound, an N-hydroxyamine ester compound, an esterified compound of a heterocyclic hydroxy compound, and the like.

More specifically, examples thereof include aromatic esters obtained through a condensation reaction between an aromatic carboxylic acid and a phenolic hydroxyl group. Aromatic esters obtained through a condensation reaction between an aromatic carboxylic acid and a phenolic hydroxyl group by using, as a raw material, a mixture of an aromatic carboxylic acid component selected from a material obtained by substituting 2 to 4 hydrogen atoms of an aromatic ring of benzene, naphthalene, biphenyl, diphenylpropane, diphenylmethane, diphenyl ether, diphenyl sulfonic acid, or the like with a carboxy group, a monovalent phenol obtained by substituting one hydrogen atom of the aforementioned aromatic ring with a hydroxy group, and a polyhydric phenol obtained by substituting 2 to 4 hydrogen atoms of an aromatic ring with a hydroxy group, and the like are preferred. That is, an aromatic ester having the aforementioned structural unit derived from an aromatic carboxylic acid component, the aforementioned structural unit derived from a monovalent phenol, and the aforementioned structural unit derived from a polyhydric phenol is preferred.

As the active ester curing agent (E), a commercially available product may be used. Examples of the commercially available product include active ester compounds including a dicyclopentadiene type diphenol structure, such as "EXB9451", "EXB9460", "EXB9460S", and "HPC-8000-65T" (all of which are manufactured by DIC Corporation); active ester compounds including a naphthalene structure, such as "EXB9416-70BK" (manufactured by DIC Corporation); active ester compounds including an acetylated material of phenol novolak, such as "DC808" (manufactured by Mitsubishi Chemical Corporation); active ester compounds including a benzoylated material of phenol novolak, such as "YLH1026" (manufactured by Mitsubishi Chemical Corporation); and the like.

Although an ester equivalent of the active ester curing agent (E) is not particularly limited, it is preferably 150 to 400 g/mol, more preferably 170 to 300 g/mol, and still more preferably 200 to 250 g/mol.

The active ester curing agent (E) may be used alone, or may be used in combination of two or more thereof.

Although the content of the active ester curing agent (E) in the second thermosetting resin composition is not particularly limited, it is preferably 10 to 90 parts by mass, more preferably 20 to 70 parts by mass, and still more preferably 30 to 60 parts by mass based on 100 parts by mass of the solid content included in the second thermosetting resin composition. When the content of the active ester curing agent (E) is 10 parts by mass or more, the curability of the second thermosetting resin composition is more improved, whereas when it is 90 parts by mass or less, there is a tendency that a lower dielectric tangent is obtained.

The content of the active ester curing agent (E) in the second thermosetting resin composition is preferably an amount at which an equivalent ratio ((ester group)/(epoxy group)) of an ester group of the active ester curing agent (E) to an epoxy group of the polyfunctional epoxy resin (D) is 0.3 to 1.5, more preferably an amount at which the foregoing equivalent ratio is 0.5 to 1.3, and still more preferably an amount at which the foregoing equivalent ratio is 0.8 to 1.2. When the content of the active ester curing agent (E) falls within the aforementioned range, not only the adhesive strength to the plated copper is more enhanced, but also a lower dielectric tangent and a smooth surface are obtained, and hence, such is suitable from the viewpoint of forming a fine wiring.

<Phenolic Hydroxyl Group-Containing Polybutadiene-Modified Polyamide Resin (F)>

Although the component (F) is not particularly limited so long as it is a phenolic hydroxyl group-containing polybutadiene-modified polyamide resin, those having a structural unit derived from a diamine, a structural unit derived from a phenolic hydroxyl group-containing dicarboxylic acid, a structural unit derived from a phenolic hydroxyl group-free dicarboxylic acid, and a structural unit derived from a polybutadiene having a carboxy group at both ends thereof are preferred. Specifically, those having a structural unit represented by the following general formula (i), a structural unit represented by the following general formula (ii), and a structural unit represented by the following general formula (iii) are preferably exemplified.

In the general formulae (i) to (iii), a, b, c, x, y, and z are each an integer expressing an average degree of polymerization; a=2 to 10; b=0 to 3; c=3 to 30; when x=1, then (y+z)=2 to 300 ((y+z)/x); and when y=1, then z 20 (z/y).

In the general formulae (i) to (iii), R's each independently represent a divalent group derived from an aromatic diamine or an aliphatic diamine; and in the general formula (iii), RP represents a divalent group derived from an aromatic dicarboxylic acid, an aliphatic dicarboxylic acid, or an oligomer having a carboxy group at both ends thereof.

The plural R's included in the general formulae (i) to (iii) may be the same as or different from each other. In addition, when z is an integer of 2 or more, the plural R"s may be the same as or different from each other.

In the general formulae (i) to (iii), specifically, it is preferred that R' is a divalent group derived from an aromatic diamine or an aliphatic diamine as mentioned later; and RP is a divalent group derived from an aromatic dicarboxylic acid, an aliphatic dicarboxylic acid, or an oligomer having a carboxy group at both ends thereof as mentioned later.

Examples of the diamine include an aromatic diamine, an aliphatic diamine, and the like.

Examples of the aromatic diamine include diaminobenzene, diaminotoluene, diaminophenol, diaminodimethylbenzene, diaminomesitylene, diaminonitrobenzene, diaminodiazobenzene, diaminonaphthalene, diaminobiphenyl, diaminodimethoxybiphenyl, diaminodiphenyl ether, diaminodimethyldiphenyl ether, methylenediamine, methylenebis(dimethylaniline), methylenebis(methoxyaniline), methylenebis(dimethoxyaniline), methylenebis(ethylaniline), methylenebis(diethylaniline), methylenebis(ethoxyaniline), methylenebis(diethoxyaniline), isopropylidenedianiline, diaminobenzophenone, diaminodimethylbenzophenone, diaminoanthraquinone, diaminodiphenyl thioether, diaminodimethyldiphenyl thioether, diaminodiphenylsulfone, diaminodiphenyl sulfoxide, diaminofluorene, and the like.

Examples of the aliphatic diamine include ethylenediamine, propanediamine, hydroxypropanediamine, butanediamine, heptanediamine, hexanediamine, cyclopentanediamine, cyclohexanediamine, azapentanediamine, triazaundecadiamine, and the like.

Examples of the phenolic hydroxyl group-containing dicarboxylic acid include hydroxyisophthalic acid, hydroxyphthalic acid, hydroxyterephthalic acid, dihydroxyisophthalic acid, dihydroxyterephthalic acid, and the like.

Examples of the phenolic hydroxyl group-free dicarboxylic acid include an aromatic dicarboxylic acid, an aliphatic dicarboxylic acid, an oligomer having a carboxy group at the both ends thereof, and the like.

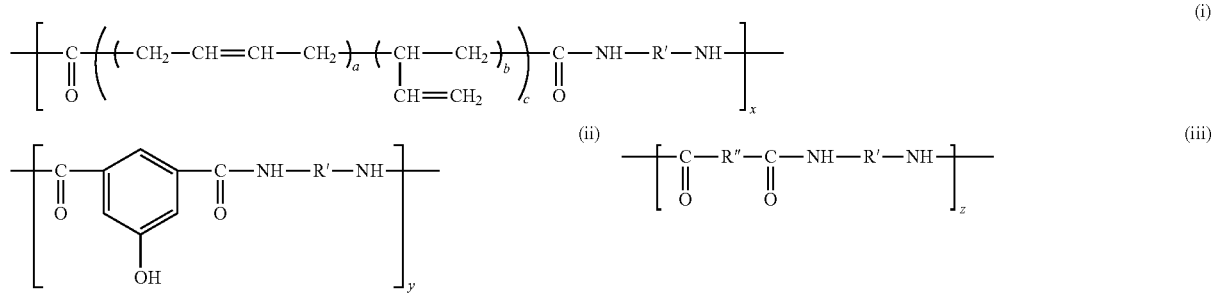

Examples of the aromatic dicarboxylic acid include phthalic acid, isophthalic acid, terephthalic acid, biphenyldicarboxylic acid, methylenedibenzoic acid, thiodibenzoic acid, carbonyldibenzoic acid, sulfonylbenzoic acid, naphthalenedicarboxylic acid, and the like.

Examples of the aliphatic dicarboxylic acid include oxalic acid, malonic acid, methylmalonic acid, succinic acid, glutaric acid, adipic acid, maleic acid, fumaric acid, malic acid, tartaric acid, (meth)acryloyloxysuccinic acid, di(meth)acryloyloxysuccinic acid, (meth) acryloyloxymalic acid, (meth) acrylamidosuccinic acid, (meth) acrylamidomalic acid, and the like.

Although a weight average molecular weight of the component (F) is not particularly limited, for example, it is preferably 60,000 to 250,000, and more preferably 80,000 to 200,000. The weight average molecular weight of the component (F) can be determined by the same method as in the weight average molecular weight of the polyimide compound (A).

Although an active hydroxy group equivalent of the component (F) is not particularly limited, it is preferably 1,500 to 7,000 g/mol, more preferably 2,000 to 6,000 g/mol, and still more preferably 3,000 to 5,000 g/mol.

The component (F) is, for example, synthesized by allowing a diamine, a phenolic hydroxyl group-containing dicarboxylic acid, a phenolic hydroxyl group-free dicarboxylic acid, and a polybutadiene having a carboxy group at the both ends thereof to react with each other in an organic solvent, such as dimethylacetamide (hereinafter also referred to as "DMAc"), etc., in the presence of, as a catalyst, a phosphorous acid ester and a pyridine derivative, thereby polycondensating the carboxy group and the amino group. As the respective compounds which can be used for the production, those described above can be exemplified.

As for the polybutadiene having a carboxy group at the both ends thereof, which can be used for the production of the component (F), its number average molecular weight is preferably 200 to 10,000, and an oligomer having a number average molecular weight of 500 to 5,000 is more preferred.

As the component (F), a commercially available product can be used. Examples of the component (F) of the commercially available product include BPAM-155, manufactured by Nippon Kayaku Co., Ltd., and the like.

Although the content of the component (F) in the second thermosetting resin composition is not particularly limited, it is preferably 1 to 20 parts by mass, more preferably 2 to 15 parts by mass, and still more preferably 3 to 10 parts by mass based on 100 parts by mass of the solid content included in the second thermosetting resin composition. When the content of the component (F) is 1 part by mass or more, the toughness of the resin composition can be enhanced, a minute roughened shape is obtained, and the adhesive strength to the plated copper can be enhanced. In addition, when the content of the component (F) is 10 parts by mass or less, the heat resistance is not deteriorated, and deterioration of the resistance to the chemical liquid at the time of roughening can be prevented from occurring. In addition, sufficient adhesion to the plated copper can be secured.

<Phosphorus-Based Curing Accelerator (G)>

It is preferred that the second thermosetting curing resin composition further contains a phosphorus-based curing accelerator (G).

The phosphorus-based curing accelerator (G) can be used without particular limitations so long as it is a curing accelerator containing a phosphorus atom and capable of accelerating the reaction between the polyfunctional epoxy resin (D) and the active ester curing agent (E).

When the second thermosetting resin composition contains the phosphorus-based curing accelerator (G), the curing reaction can be much more sufficiently advanced. As for this reason, it may be assumed that by using the phosphorus-based curing accelerator (G), electron-withdrawing properties of the carbonyl group in the active ester curing agent (E) can be enhanced, whereby the reaction between the active ester curing agent (E) and the polyfunctional epoxy resin (D) is accelerated.

In this way, in view of the fact that the second thermosetting resin composition contains the phosphorus-based curing accelerator (G), it may be considered that as compared with the case of using other curing accelerator, the curing reaction between the polyfunctional epoxy resin (D) and the active ester curing agent (E) is much more sufficiently advanced, so that when combined with the first resin layer, a low dielectric tangent is obtained.

Examples of the phosphorus-based curing accelerator (G) include organic phosphines, such as triphenylphosphine, a diphenyl(alkylphenyl)phosphine, a tris(alkylphenyl)phosphine, a tris(alkoxyphenyl)phosphine, a tris(alkylalkoxyphenyl)phosphine, a tris(dialkylphenyl)phosphine, a tris(trialkylphenyl)phosphine, a tris(tetraalkylphenyl)phosphine, a tris(dialkoxyphenyl)phosphine, a tris(trialkoxyphenyl)phosphine, a tris(tetraalkoxyphenyl)phosphine, a trialkylphosphine, a dialkylarylphosphine, an alkyldiarylphosphine, etc.; complexes between an organic phosphine and an organic boron; adducts between a tertiary phosphine and a quinone; and the like.

From the viewpoint that the curing reaction is more sufficiently advanced, whereby high adhesion to the plated copper can be exhibited, adducts between a tertiary phosphine and a quinone are preferred.

Although the tertiary phosphine is not particularly limited, examples thereof include tri-n-butylphosphine, dibutylphenylphosphine, butyldiphenylphosphine, ethyldiphenylphosphine, triphenylphosphine, tris(4-methylphenyl)phosphine, tris(4-methoxyphenyl)phosphine, and the like. In addition, examples of the quinone include o-benzoquinone, p-benzoquinone, diphenoquinone, 1,4-naphthoquinone, anthraquinone, and the like. From the standpoints of adhesion to the plated copper and heat resistance as well as the matter that a smooth surface is obtained, for example, an adduct between tri-n-butylphosphine and p-benzoquinone is more preferred.

Examples of a production method of an adduct between a tertiary phosphine and a quinone include a method in which the tertiary phosphine and the quinone serving as the raw materials are stirred and mixed in a solvent in which the both are soluble, to undergo an addition reaction, followed by isolation; and the like. In this case, as for a production condition, for example, it is preferred that the tertiary phosphine and the quinone are stirred in a solvent, for example, a ketone, such as methyl isobutyl ketone, methyl ethyl ketone, acetone, etc., or the like at a temperature ranging from 20 to 80° C. for 1 to 12 hours, to undergo an addition reaction.

The phosphorus-based curing accelerator (G) may be used alone, or may be used in combination of two or more thereof. In addition, one or more curing accelerators other than the phosphorus-based curing accelerator (G) may also be jointly used.

Although the content of the phosphorus-based curing accelerator (G) in the second thermosetting resin composition is not particularly limited, it is preferably 0.1 to 10 parts by mass, more preferably 0.2 to 5 parts by mass, and still more preferably 0.4 to 2 parts by mass based on 100 parts by mass of the solid content included in the second thermosetting resin composition. When the content of the phosphorus-based curing accelerator (G) is 0.1 parts by mass or more, the curing reaction can be sufficiently advanced, whereas when it is 10 parts by mass or less, homogeneity of the cured material can be kept.

<Filler (H)>

The second thermosetting resin composition may contain a filler (H). Examples of the filler (H) include an inorganic filler, an organic filler, and the like.

When the filler (H) is contained, scattering of the resin on the occasion of subjecting the second insulating layer to laser processing can be more reduced.

Although the inorganic filler is not particularly limited, for example, the same materials exemplified for the inorganic filler (C) can be used.

From the viewpoint of forming a fine wiring on the second resin layer, a particle diameter of the inorganic filler is preferably 20 m$^2$/g or more, and more preferably 50 m$^2$/g or more in terms of a specific surface area. Although an upper limit of the specific surface area is not particularly limited, from the viewpoint of easiness of availability, it is preferably 500 m$^2$/g or less, and more preferably 200 m$^2$/g or less.

The specific surface area can be determined by the BET method based on physical adsorption of an inactive gas at low temperature and low humidity. Specifically, a molecule whose absorption occupied area is already-known is adsorbed on the surface of a powder particle at a liquid nitrogen temperature, and the specific surface area of the powder particle can be determined from the adsorption amount.

As the inorganic filler having a specific surface area of 20 m$^2$/g or more, a commercially available product may be used. Examples of the commercially available product include AEROSIL R972 (a trade name, manufactured by Nippon Aerosil Co., Ltd., specific surface area: 110±20 m$^2$/g) and AEROSIL R202 (a trade name, manufactured by Nippon Aerosil Co., Ltd., specific surface area: 100±20 m$^2$/g), all of which are fumed silica; PL-1 (a trade name, manufactured by Fuso Chemical Co., Ltd., specific surface area: 181 m$^2$/g) and PL-7 (a trade name, manufactured by Fuso Chemical Co., Ltd., specific surface area: 36 m$^2$/g), all of which are colloidal silica; and the like. In addition, from the viewpoint of improving the humidity resistance, the inorganic filler is preferably an inorganic filler having been subjected to a surface treatment with a surface treating agent, such as a silane coupling agent, etc.

The content of the inorganic filler in the second thermosetting resin composition is preferably 1 to 30 parts by mass, more preferably 2 to 25 parts by mass, still more preferably 3 to 20 parts by mass, and especially preferably 5 to 20 parts by mass based on 100 parts by mass as expressed in terms of the solid content of the resin components in the second thermosetting resin composition. When the content of the inorganic filler is 1 part by mass or more, there is a tendency that more excellent laser processability is obtained, whereas when it is 30 parts by mass or less, there is a tendency that adhesive properties between the second resin layer and the conductor layer are more improved.

Although the organic filler is not particularly limited, for example, as a copolymer of acrylonitrile and butadiene, a crosslinked NBR particle obtained through copolymerization of acrylonitrile and butadiene; a copolymer obtained through copolymerization of acrylonitrile, butadiene, and a carboxylic acid, such as acrylic acid, etc.; a so-called core-shell rubber particle in which a core is formed of polybutadiene, NBR, and a silicone rubber, and a shell is formed of an acrylic acid derivative; and the like are usable. When the organic filler is contained, the elongation of the resin layer is more improved.

<Cyanate Resin (J)>

The second thermosetting resin composition may contain a cyanate resin (J). The cyanate resin (J) is not particularly limited. Examples thereof include a bisphenol type cyanate resin, such as a bisphenol A type, a bisphenol F type, a bisphenol S type, etc.; a novolak type cyanate resin, such as a phenol novolak type, an alkylphenol novolak type, etc.; a dicyclopentadiene type cyanate resin; a prepolymer in which a part of the foregoing cyanate resin is converted into a triazine; and the like. The cyanate resin (J) may be used alone or in combination of two or more thereof.

Although a weight average molecular weight of the cyanate resin (J) is not particularly limited, it is preferably 500 to 4,500, and more preferably 600 to 3,000. When the weight average molecular weight is 500 or more, crystallization of the cyanate resin (J) is suppressed, and there is a tendency that the solubility in an organic solvent becomes more excellent. In addition, when the weight average molecular weight is 4,500 or less, an increase of the viscosity is suppressed, and there is a tendency that the workability is more excellent. The weight average molecular weight of the cyanate resin (J) can be determined from a value as expressed in terms of standard polystyrene by means of gel permeation chromatography (GPC).

Although the content of the cyanate resin (J) in the second thermosetting resin composition is not particularly limited, it is preferably 20 to 60 parts by mass, more preferably 30 to 50 parts by mass, and still more preferably 35 to 45 parts by mass based on 100 parts by mass of the solid content included in the second thermosetting resin composition. When the content of the cyanate resin (J) is 20 parts by mass or more based on 100 parts by mass of the solid content included in the second thermosetting resin composition, there is a tendency that more excellent dielectric characteristics, heat resistance, and low thermal expansion properties are obtained, whereas when it is 60 parts by mass or less, there is a tendency that the adhesive properties to the conductor layer are more excellent.

<Other Components>

The second thermosetting resin composition can contain, in addition to the aforementioned respective components, other thermosetting resin, a thermoplastic resin, and additives, such as a flame retardant, an antioxidant, a fluidity controlling agent, a curing accelerator, etc., and so on as the need arises so long as the effects of the present invention are not impaired.

In the composite film of the present embodiment, a support may be further provided on a surface of the second resin layer on the side opposite to the first resin layer.

Examples of the support include the same supports which can be used for the resin film for interlayer insulation of the present embodiment as mentioned above.

The resin composition which is used for the second resin layer is not limited to the aforementioned second thermosetting resin composition. For example, the resin composition may also be a resin composition containing the polyfunctional epoxy resin (D), the filler (H), and the cyanate resin (J). In that case, a preferred mode is the same as that explained in the aforementioned second thermosetting resin composition.

<Production Method of Composite Film>

The composite film of the present embodiment can be, for example, produced by a method of forming the second resin layer on the support and forming thereon the first resin layer.

For the formation of the first resin layer, the aforementioned first thermosetting resin composition or a varnish for resin film for interlayer insulation (here also referred to as "varnish for first resin layer") can be used.

For the formation of the second resin layer, it is preferred to use the second thermosetting resin composition or a resin varnish having the second thermosetting resin composition dissolved or dispersed in an organic solvent (hereinafter also referred to as "varnish for second resin layer").

A production method of the varnish for second resin layer and the organic solvent which is used for the production of the varnish for second resin layer are the same as those in the aforementioned varnish for resin film for interlayer insulation.

A blending amount of the organic solvent is preferably 70 to 95 parts by mass, and more preferably 80 to 90 parts by mass based on 100 parts by mass of a total mass of the varnish for second resin layer.

The "varnish" as referred to in the present specification is synonymous with the "organic solvent-containing resin composition" from the standpoint of composition.

The composite film can be formed by coating the varnish for second resin layer on the support and then heating for drying, and further coating thereon the varnish for first resin layer and then heating for drying.

The coating method of the varnish for second resin layer or the varnish for first resin layer, and drying condition after coating such a varnish are the same as the coating method and drying condition in the production method of the resin film for interlayer insulation of the present embodiment, respectively.

In the case of embedding the conductor layer of the circuit board, a thickness of the first resin layer to be formed in the composite film of the present embodiment is preferably the thickness of the conductor layer of the circuit board or more. Specifically, since the thickness of the conductor layer which the circuit board has is typically in a range of 5 to 70 µm, the thickness of the first resin layer is preferably 10 to 100 µm. In addition, from the viewpoints of high frequency characteristics and formation of a fine wiring, the thickness of the second resin layer is preferably 1 to 15 µm.

From the viewpoint of more enhancing the high frequency characteristics, a ratio in thickness of the first resin layer to the second resin layer in the composite film of the present embodiment is preferably 1,000/1 to 1/10, more preferably 100/1 to 1/10, and still more preferably 50/1 to 1/5.

A protective film may be provided on a surface of the first resin layer on which the second resin layer is not provided. Although the thickness of the protective film is not particularly limited, for example, it may be 1 to 40 µm. By providing the protective film, attachment of a dust, etc. and scratch on the surface of the first resin layer can be prevented from occurring. The composite film can be stored upon being wound up in a roll state.

In the composite film of the present embodiment, a dielectric tangent of a cured material at 5 GHz is preferably 0.005 or less, more preferably 0.004 or less, and still more preferably 0.003 or less. The dielectric tangent of the cured material of the composite film of the present embodiment can be determined by the method described in the Examples.

A peel strength of the cured material of the composite film of the present embodiment is preferably 0.5 kgf/cm or more, more preferably 0.6 kgf/cm or more, and still more preferably 0.7 kgf/cm or more from the viewpoint of adhesion to the conductor layer. Although an upper limit of the peel strength is not particularly present, for example, it can be made 15 kgf/cm. The peel strength is a value measured by the method described in the Examples.

A surface roughness Ha of the cured material of the composite film of the present embodiment is preferably 250 nm or less, more preferably 200 nm or less, and still more preferably 180 nm or less from the viewpoint of forming a fine wiring. Although a lower limit value of the surface roughness is not particularly present, it is preferably 1 nm or more from the viewpoint of more enhancing the peel strength. The surface roughness is a value measured by the method described in the Examples.

[Printed Wiring Board and Production Method of Same]

A printed wiring board of the present embodiment includes a cured material of the resin film for interlayer insulation of the present embodiment or a cured material of the composite film of the present embodiment. In other words, the printed wiring board of the present embodiment has interlayer insulating layers, and at least one of the interlayer insulating layers includes the thermosetting resin composition of the present embodiment.

A method of producing a printed wiring board by laminating the resin film for interlayer insulation or composite film of the present embodiment is hereunder explained.

The method of producing a printed wiring board according to the present embodiment includes the following step (1), and furthermore, it includes the following steps (2) to (5) as the need arises. After the step (1), the step (2), or the step (3), the support may be exfoliated or removed.

Step (1): A step of laminating the resin film for interlayer insulation or composite film of the present embodiment on one or both surfaces of a substrate Step (2): A step of thermally curing the resin film for interlayer insulation or composite film to form an interlayer insulating layer Step (3): A step of boring the substrate having the interlayer insulating layer formed thereon Step (4): A step of subjecting the surface of the interlayer insulating layer to a roughening treatment Step (5): A step of forming a conductor layer on the surface of the roughened interlayer insulating layer <Step (1)>

The step (1) is a step of laminating the resin film for interlayer insulation or composite film of the present embodiment on one or both surfaces of a substrate. Examples of an apparatus for laminating the resin film for interlayer insulation or composite film include a vacuum laminator. As the vacuum laminator, a commercially available product can be used. Examples of the vacuum laminator as the commercially available product include a vacuum applicator, manufactured by Nichigo-Morton Co., Ltd.; a vacuum & pressure laminator, manufactured by Meiki Co., Ltd.; a roll-type dry coater, manufactured by Hitachi Industries Co., Ltd.; a vacuum laminator, manufactured by Hitachi AIC Inc.; and the like.

The substrate is not particularly limited, and a circuit board, an insulating substrate, and other wiring board materials can be used.

The circuit board is not particularly limited so long as it is an insulating board provided with a circuit on at least one principal surface, and it may be one in which a circuit is formed on only one surface, or may also be one in which a circuit is formed on both surfaces of an insulating board, as obtained using a both face copper clad laminated sheet. As this circuit board, a known laminated sheet which is used in a usual wiring board (e.g., glass cloth-epoxy resin, paper-phenol resin, paper-epoxy resin, glass paper-epoxy resin, etc.) can be used. In addition, the circuit board may be a multi-layered sheet in which the circuit is formed on three or more layers. The circuit of the circuit board may be formed by any of known methods. A known production method of a wiring board, such as a subtractive method in which an unnecessary portion of a copper foil in a copper clad laminated sheet having a copper foil and the aforementioned insulating substrate stuck to each other is removed by means of etching; an additive method in which a circuit is formed in a necessary portion of the aforementioned insulating board by means of electroless plating; etc., can be adopted.

The insulating substrate is not particularly limited so long as it is an insulator, and a known wiring material, such as a prepreg, a resin film, etc., can be used. As a commercially available prepreg, for example, "GWA-900G", "GWA-910G", "GHA-679G", "GHA-679G(S)", and "GZA-71G" (all of which are a trade name), all of which are manufactured by Hitachi Chemical Company, Ltd., and the like can be used.

In the lamination, in the case where the resin film for interlayer insulation or composite film has a protective film, after removing the protective film, the resin film for interlayer insulation or composite film is subjected to pressure bonding to the substrate while applying a pressure and/or heating.

In the case of using the composite film, the first resin layer is disposed such that it is opposed to the substrate.

As for a condition of the lamination, the resin film for interlayer insulation or composite film and the substrate may be preheated as the need arises and laminated at a pressure bonding temperature (laminating temperature) of 60 to 140° C. and a pressure bonding pressure of 0.1 to 1.1 mPa ($9.8 \times 10^4$ to $107.9 \times 10^4$ $N/m^2$) under reduced pressure of 20 mmHg (26.7 hPa) or less in terms of an air pressure. In addition, the method of lamination may be either a batch mode or a continuous mode with a roll.

<Step (2)>

The step (2) is a step of thermally curing the resin film for interlayer insulation or composite film to form an interlayer insulating layer. Although a condition of thermal curing is not particularly limited, for example, it can be selected within a range at 170 to 220° C. for 20 to 80 minutes. After thermally curing the resin film for interlayer insulation or composite film, the support may be exfoliated.

<Step (3)>

As the step (3), a step of boring the substrate having the interlayer insulating layer formed thereon may be performed. In the present step, the interlayer insulating layer and the substrate are bored by a method using a drill, a laser, a plasma, or a combination thereof, or the like, thereby forming a via hole, a through-hole, or the like. As the laser, a carbon dioxide gas laser, a YAG laser, a UV laser, an excimer laser, and so on are generally used.

<Step (4)>

The step (4) is a step of subjecting the surface of the interlayer insulating layer to a roughening treatment. In the present step, in the case where a via hole, a through-hole, or the like is formed at the same time of subjecting the surface of the interlayer insulating layer formed in the step (2) with an oxidizing agent, the removal of "smear" generated on the occasion of forming such a hole or the like can also be performed.

Although the oxidizing agent is not particularly limited, examples thereof include permanganates (e.g., potassium permanganate, sodium permanganate), bichromates, ozone, hydrogen peroxide, sulfuric acid, nitric acid, and the like. Among them, roughening and removal of smear may be performed using an alkaline permanganate solution (for example, a potassium permanganate or sodium permanganate solution) that is an oxidizing agent which is widely used for roughening of an interlayer insulating layer in the production of a printed wiring board by the build-up process.

From the viewpoint of forming a fine wiring, a surface roughness of the interlayer insulating layer after the roughening treatment is preferably 250 nm or less, more preferably 200 nm or less, and still more preferably 180 nm or less. Although a lower limit value of the surface roughness is not particularly present, from the viewpoint of more enhancing the peel strength, it is preferably 1 nm or more.

<Step (5)>

The step (5) is a step of forming a conductor layer on the surface of the roughened interlayer insulating layer. In the present step, for example, the circuit can be formed by means of plating adopting a subtractive method, a semi-active method, or the like. The semi-active method is a method in which a power feeding layer is formed on the surface of the interlayer insulating layer by means of electroless plating, a plated resist with a reverse pattern to the conductor layer is subsequently formed, and a conductor layer (circuit) is formed by means of electroplating. After forming the conductor layer, for example, the resultant is subjected to an annealing treatment at 150 to 200° C. for 20 to 90 minutes, whereby the adhesive strength between the interlayer insulating layer and the conductor layer can be improved and stabilized.

According to the aforementioned steps, the printed wiring board of the present embodiment can be produced. If desired, by repeating the aforementioned steps, a multi-layered printed wiring board can also be obtained. The term "multi-layered" indicates the matter that the printed wiring board has three or more conductor layers.

In the case of repeating the aforementioned steps, a step of roughening the surface of the conductor layer may be further included. The roughening of the surface of the conductor layer has an effect for enhancing the adhesion to a resin which subsequently comes into contact with the conductor layer. Although a treating agent for roughening the conductor layer is not particularly limited, examples thereof include MECetchBOND CZ-8100, MECetchBOND CZ-8101, and MECetchBOND CZ-5480 (all of which are a trade name, manufactured by i Co., Ltd.), all of which are an organic acid-based microetching agent.

Although the thermosetting resin composition, the second thermosetting resin composition, the resin film for interlayer insulation, and the composite film of the present embodiments are not particularly limited with respect to applications, they can be used over a wide range of application in which an interlayer insulating layer is considered to be needed, inclusive of an insulating resin sheet, such as a printed wiring board, an adhesive film, a prepreg, etc., a circuit board, a solder resist, a underfill material, a die bonding material, a semiconductor sealing material, a hole plugging resin, a module-embedding resin, and the like. Among these, they can be suitably used for forming an interlayer insulating layer in the production of a printed wiring board.

The thermosetting resin composition, the second thermosetting resin composition, the resin film for interlayer insulation, and the composite film of the present embodiments can be, for example, suitably used for the purpose of producing a wiring board having a fine wiring formed thereon. Specifically, they can be suitably used for the purpose of forming a wiring having a line-and-space (LIS) of 10 μm/10 μm or less, and in particular, can be suitably used for the purpose of forming a wiring of 5 μm/5 μm or less, and moreover 3 μm/3 μm or less.

The thermosetting resin composition, the second thermosetting resin composition, the resin film for interlayer insulation, and the composite film of the present embodiments can be especially suitably used for electronic devices dealing with high frequency signals of 1 GHz or more, and in particular, can be suitably used for electronic devices dealing with high frequency signals of 5 GHz or more, high frequency signals of 10 GHz or more, or high frequency signals of 30 GHz or more.

It should be construed that the present invention is not limited to the aforementioned embodiments. The aforementioned embodiments are examples, and any embodiments having configurations and effects substantially similar to technical concepts described in the claims of the present invention are also included within the technical scope of the present invention.

EXAMPLES

The present invention is more specifically described by reference to the following Examples, but it should be construed that the present invention is by no means limited to these Examples.

Production Example 1

<Production of Polyimide Compound (A)>

In a glass-made flask vessel having a volume of one liter, which was equipped with a thermometer, a reflux condenser, and a stirring device and which could be heated and cooled, 114.8 g of 3,3'-dimethyl-5,5'-diethyl-4,4'-diphenylmethane bismaleimide (a trade name: BMI-5100, manufactured by Daiwa Fine Chemicals Co., Ltd.) (component (a1)), 345.5 g of 2,2-bis(4-(4-maleimidophenoxy)phenyl)propane (a trade name: BMI-4000, manufactured by Daiwa Fine Chemicals Co., Ltd.) (component (a1)), 59.6 g of 4,4'[1,3-phenylenebis (1-methylethylidene)]bisaniline (a trade name: BISANI-LINE M, manufactured by Mitsui Fine Chemicals, Inc. (component (a2)), and 280 g of propylene glycol monomethyl ether were charged, and the contents were allowed to react with each other with stirring for 3 hours while keeping a liquid temperature at 120° C. Thereafter, the reaction product was confirmed to have a weight average molecular weight of 900 by means of gel permeation chromatography (GPC), cooled, and then subjected to 200-mesh filtration to produce a polyimide compound (A) (solid content concentration: 65% by mass).

<Measurement Method of Weight Average Molecular Weight>

The weight average molecular weight of the resulting polyimide compound (A) was converted from a calibration curve using standard polystyrene by means of GPC. The calibration curve was approximated according to a cubic expression using standard polystyrene: TSKstandard POLYSTYRENE (Type: A-2500, A-5000, F-1, F-2, F-4, F-10, F-20, F-40) [a trade name, manufactured by Tosoh Corporation]. A condition of GPC is as follows.

Apparatus:
(Pump: L-6200 Model [manufactured by Hitachi High-Technologies Corporation])
(Detector: L-3300 Model RI [manufactured by Hitachi High-Technologies Corporation])
(Column oven: L-655A-52 [manufactured by Hitachi High-Technologies Corporation])
Column: Guard column; TSK Guardcolumn HHR-L+ Column; TSK
  gel-G4000HHR+TSK gel-G2000HHR (all of which are a trade name,
  manufactured by Tosoh Corporation)
Column size: 6.0×40 mm (guard column), 7.8×300 mm (column)
Elute: Tetrahydrofuran
Sample concentration: 30 mg/5 mL
Injection amount: 20 μL
Flow rate: 1.00 mL/min
Measurement temperature: 40° C.

Preparation of Resin Film for Interlayer Insulation

Example 1

Aminosilane coupling agent-treated silica (a trade name: SC-2050-KNK, a methyl isobutyl ketone dispersion liquid having a solid content concentration of 70% by mass, manufactured by Admatechs Co., Ltd.) as the inorganic filler (C) and a modified polybutadiene (a trade name: Ricon 130MA8, manufactured by Cray Valley) as the modified polybutadiene (B) were mixed in a blending ratio such that the content of the inorganic filler (C) was 54% by mass in a total mass of an organic solvent-free resin film for interlayer insulation, and that the content of the modified polybutadiene (B) was 20% by mass in all of the resin components contained in the resin film for interlayer insulation.

The polyimide compound (A) produced in Production Example 1 was then mixed therein in a ratio such that the content of the polyimide compound (A) was 80% by mass in all of the resin components contained in the resin film for interlayer insulation, and dissolved at room temperature by a high-speed rotary mixer.

After dissolution of the polyimide compound (A) was confirmed through visual inspection, an isocyanate-masked imidazole (a trade name: G8009L, manufactured by Dai-ichi Kogyo Seiyaku Co., Ltd.) as a curing accelerator was mixed in an amount of 0.3 phr relative to the component (a1) as the raw material as converted from the charged amount of the polyimide compound (A). Subsequently, the mixture was dispersed by a nanomizer treatment, to obtain a varnish 1 for preparing a resin film for interlayer insulation.

Subsequently, this varnish 1 was coated on a PET film (thickness: 38 μm) serving as a support by using a comma coater such that a thickness of the resin film for interlayer insulation after drying was 37 μm, followed by drying at 85° C. for 2 minutes. The amount of the volatile component in the resin film for interlayer insulation after drying was 6% by mass. Subsequently, the resultant was wound up in a roll state while sticking a polypropylene film having a thickness of 15 μm serving as a protective film onto the surface of the resin film for interlayer insulation, to obtain a resin film 1 for interlayer insulation having a support and a protective film.

Examples 2 to 3 and Comparative Examples 1 to 3

Varnishes 2 to 6 for preparing a resin film for interlayer insulation were obtained in the same manner as in Example 1, except for changing the respective components and their blending amounts to those in blends as shown in Table 1. Subsequently, using the varnishes 2 to 6, films 2 to 6 for interlayer insulation each having a support and a protective film were obtained.

Preparation of Composite Film

Example 4

<Synthesis of Prepolymer of Bisphenol A Dicyanate>

In a separable flask having a volume of one liter, 269.6 g of toluene, 620.4 g of 2,2-bis(4-cyanatophenyl)propane (a trade name: Primaset BADCY, manufactured by Lonza Japan Ltd.), and 9.5 g of p-(α-cumyl)phenol (manufactured by Tokyo Chemical Industry Co., Ltd.) were charged. After dissolution of 2,2-bis(4-cyanatophenyl)propane and p-(α-cumyl)phenol in toluene was confirmed through visual inspection, the liquid temperature was kept at 100° C., and 0.46 g of zinc naphthenate (manufactured by Wako Pure Chemical Industries, Ltd.) diluted in a ratio of 10% by mass relative to a reaction solvent (toluene in this study) as a reaction accelerator was blended and allowed to react in a nitrogen atmosphere at 100° C. for 3 hours, to produce a prepolymer solution of bisphenol A dicyanate (solid content concentration: 70% by mass). As for the aforementioned reaction, a point of time when a viscosity of the reaction solution at 25° C. as measured using an E-type viscometer fell within a range of 70 to 90 mPa·s was defined as an end point.

<Production of Varnish 1 for Second Resin Layer>

32.2 parts by mass (solid content) of the thus obtained prepolymer of bisphenol A dicyanate, 42.8 parts by mass of a naphthalene cresol novolak type epoxy resin (a trade name: NC-7000L, manufactured by Nippon Kayaku Co., Ltd., epoxy equivalent: 231 g/mol), 8.8 parts by mass of an inorganic filler (a trade name: AEROSIL R972, manufactured by Nippon Aerosil Co., Ltd., specific surface area: 110 m$^2$/g), and dimethylacetamide as a solvent in an amount of 86.5 parts by mass based on 100 parts by mass of a total mass (including the organic solvent) were blended and stirred at room temperature until dissolution of the resin components was confirmed through visual inspection. Thereafter, the resultant was dispersed by a nanomizer treatment, to obtain a varnish 1 for second resin layer.

<Production of Varnish 1 for First Resin Layer>

A varnish 1 for preparing a resin film for interlayer insulation was prepared by the same method as in Example 1 and designated as a varnish 1 for first resin layer.

<Production of Composite Film>

The varnish 1 for second resin layer was coated on a PET film (thickness: 38 μm) serving as a support by using a comma coater such that a thickness of the second resin layer after drying was 3 μm, followed by drying at 140° C. for 3 minutes to form the second resin layer on the PET film. Subsequently, the varnish 1 for first resin layer was coated on the thus obtained second resin layer by using a comma coater such that a thickness of the first resin layer after drying was 40 μm, followed by drying at 85° C. for 2 minutes. Subsequently, the resultant was wound up in a roll state while sticking a polypropylene film having a thickness of 15 μm serving as a protective film onto the surface of the composite film on which the second resin layer was not provided, to obtain a composite film 1 having a support and a protective film.

[Preparation of Resin Sheet]

A resin sheet used for the measurement of dielectric tangent was prepared according to the following procedures.
(I) The protective film was exfoliated from the resin film for interlayer insulation having a support and a protective film obtained in each of Examples 1 to 3 and Comparative Examples 1 to 3, followed by drying at 110° C. for 3 minutes.

Subsequently, the resin film for interlayer insulation having a support after drying was laminated on a glossy surface of a copper foil (electrolytic copper foil, thickness: 35 μm) by using a vacuum & pressure laminator (a trade name: MVLP-500/600-II, manufactured by Meiki Co., Ltd.) such that the resin film for interlayer insulation and the copper foil came into contact with each other, to obtain a laminate (P) in which the copper foil, the resin film for interlayer insulation, and the support were laminated in this order. The lamination was performed by a method in which the pressure was reduced for 30 seconds to an extent of 0.5 MPa, and the resultant was then pressed at 130° C. for 30 seconds under a pressure bonding pressure of 0.5 MPa. Thereafter, the support was exfoliated from the laminate (P).
(II) Subsequently, a resin film for interlayer insulation having a PET film as a support and a polypropylene film as a protective film was prepared, and the protective film was exfoliated, followed by drying at 110° C. for 3 minutes.
(III) Subsequently, the laminate (P) obtained in the above (I), from which the support had been exfoliated, and the resin film for interlayer insulation having a support after drying as obtained in the above (II) were laminated under the same condition as in the above (I) such that the resin films for interlayer insulation came into contact with each other, to obtain a laminate (Q) in which the copper foil, the layers composed of two layers of the resin film for interlayer insulation, and the support were laminated in this order. Thereafter, the support was exfoliated from the laminate (Q).
(IV) Subsequently, the laminate (Q) obtained in the above (III), from which the support had been exfoliated, and a resin film for interlayer insulation having a support after drying as obtained by the same method as in the above (II) were laminated under the same condition as in the above (I) such that the resin films for interlayer insulation came into contact with each other, to obtain a laminate (R) in which the copper foil, the layers composed of three layers of the resin film for interlayer insulation, and the support were laminated in this order.
(V) A laminate (Q) was prepared in the same methods as in the above (I) to (III). (VI) The supports of the laminate (Q) obtained in the above (V) and the laminate (R) obtained in the above (I) to (IV) were exfoliated, respectively, the resin films for interlayer insulation of the laminate (Q) and the laminate (R) were stuck to each other, and the resultant was subjected to press molding using a vacuum press at 190° C. for 60 minutes under a pressure bonding pressure of 3.0 MPa. The resulting resin sheet provided with a copper foil on the both surfaces thereof was cured at 190° C. for 2 hours, and the copper foils were etched with ammonium persulfate, to obtain a resin sheet.

[Measurement Method of Dielectric Tangent]

The above-prepared resin sheet was cut out into a test piece having a width of 2 mm and a length of 70 mm, which was then measured for dielectric tangent using a network analyzer (a trade name: E8364B, manufactured by Agilent Technologies) and a 5 GHz-enabled cavity resonator (manufactured by Kanto Electronic Application and Development Inc.). The measurement temperature was set to 25° C. The evaluation results are shown in Table 1. It is indicated that the lower the dielectric tangent, the more excellent the dielectric characteristics are.

[Evaluation Method of Handling Properties of Film]

The handling properties of the resin film for interlayer insulation having a support and a protective film obtained in each of Examples 1 to 3 and Comparative Examples 1 to 3 were evaluated by the following methods.

(1) Evaluation by Cutting with Cutter:

The presence or absence of powder dropping on the occasion of cutting the above-prepared resin film for interlayer insulation having a support and a protective film with a cutter was evaluated. The presence or absence of powder dropping was confirmed through visual inspection, and in the case where no powder dropping was observed, the handling properties were evaluated to be excellent.

(2) Evaluation by Bending:

When the protective film was exfoliated from the above-prepared resin film for interlayer insulation having a support and a protective film, and the resultant was bent at 180° from the support toward the resin-coated surface, the presence or absence of cracking of the film was evaluated. The presence or absence of cracking of the film was confirmed through visual inspection, and in the case where no cracking was generated, the handling properties were evaluated to be excellent.

In the evaluations of the above (1) and (2), the case where all of the handling properties were excellent was designated as "A", and the case other than that was designated as "B". The evaluation results are shown in Table 1.

[Presence or Absence of Resin Separation]

The presence or absence of resin separation was confirmed through observation of a cross section of an interlayer insulating layer formed on a printed wiring board with a scanning electron microscope (SEM). The protective film of the resin film for interlayer insulation having a support and a protective film obtained in each of Examples 1 to 3 and Comparative Examples 1 to 3 was exfoliated, and the resultant was laminated on a printed wiring board having been subjected to a CZ treatment (MCL-E-700GR (a trade name, manufactured by Hitachi Chemical Company, Ltd.) was used as a laminated sheet) such that the resin film for interlayer insulation and the printed wiring board came into contact with each other. The lamination was performed by a method in which the pressure was reduced for 30 seconds to an extent of 0.5 MPa, and the resultant was then pressed at 130° C. for 30 seconds under a pressure bonding pressure of 0.5 MPa. Thereafter, the laminate was cooled to room temperature, and the support was exfoliated and removed to obtain a printed wiring board having the resin film for interlayer insulation disposed therein. Subsequently, the printed wiring board was heated in an explosion-proof dryer at 190° C. for 60 minutes, to obtain a printed wiring board having an interlayer insulating layer formed therein. A cross section of the interlayer insulating layer of the resulting printed wiring board was observed with a field emission scanning electron microscope (a trade name: S-4700, manufactured by Hitachi, Ltd.), thereby confirming the presence or absence of resin separation. The observation by the field emission scanning electron microscope was performed at an accelerating voltage of 10 V and an emission current of 10 µA. A cross-sectional SEM photograph of the interlayer insulating layer obtained in each of Examples 1 to 3 and Comparative Examples 1 to 3 is shown in FIG. 2. In the cross-sectional SEM photograph of the interlayer insulating layer, the case where the resin separation was confirmed was designated as "Yes", and the case where the resin separation was not confirmed was designated as "No". In this evaluation, the case of "No" is preferred. The evaluation results are shown in Table 1.

[Evaluation Method of Surface Gloss Unevenness of Interlayer Insulating Layer]

The evaluation of the surface gloss unevenness of the interlayer insulating layer was made through visual inspection. The protective film of the resin film for interlayer insulation having a support and a protective film obtained in each of Examples 1 to 3 and Comparative Examples 1 to 3 was exfoliated, and the resultant was laminated on a printed wiring board having been subjected to a CZ treatment (MCL-E-700GR (a trade name, manufactured by Hitachi Chemical Company, Ltd.) was used as a laminated sheet) such that the resin film for interlayer insulation and the printed wiring board came into contact with each other. The lamination was performed by a method in which the pressure was reduced for 30 seconds to an extent of 0.5 MPa, and the resultant was then pressed at 130° C. for 30 seconds under a pressure bonding pressure of 0.5 MPa. Thereafter, the laminate was cooled to room temperature, and the support was exfoliated to obtain a printed wiring board having the resin film for interlayer insulation disposed therein. Subsequently, the printed wiring board was cured in an explosion-proof dryer at 190° C. for 60 minutes, to obtain a printed wiring board having an interlayer insulating layer formed therein. As for the gloss unevenness, the surface of the interlayer insulating layer of the resulting printed wiring board was observed through visual inspection. The case where the surface of the interlayer insulating layer was free from resin separation, etc. and exhibited a uniform appearance was designated as "No", whereas the case where the surface of the interlayer insulating layer caused resin separation, etc. and exhibited a non-uniform appearance was designated as "Yes". In this evaluation, the case of "No" is preferred. The evaluation results are shown in Table 1.

[Measurement Method of Surface Roughness]

In measuring the surface roughness, a board for surface roughness measurement was prepared according to the following procedures.

The composite film having a support and a protective film as obtained in Example 4 was cut into a size of 250 mm×250 mm, and the protective film was then exfoliated.

The resulting composite film having a support was laminated on a printed wiring board having been subjected to a CZ treatment (MCL-E-700GR (a trade name, manufactured by Hitachi Chemical Company, Ltd.) was used as a laminated sheet) such that the first resin layer and the printed wiring board came into contact with each other. The lamination was performed by a method in which the pressure was reduced for 30 seconds to an extent of 0.5 MPa, and the resultant was then pressed at 130° C. for 30 seconds under a pressure bonding pressure of 0.5 MPa.

Thereafter, the laminate was cooled to room temperature, and the support was exfoliated to obtain a printed wiring board having the composite film disposed therein. Subsequently, the printed wiring board having the composite film disposed therein was cured in an explosion-proof dryer at 190° C. for 60 minutes, to obtain a printed wiring board having an interlayer insulating layer formed therein. The printed wiring board was cut out into a test piece of 30 mm×40 mm.

The thus obtained test piece was subjected to a dipping treatment with a swelling solution heated at 60° C. (a trade name: CIRCUPOSIT MLB CONDITIONER 211, manufactured by Rohm and Haas Electronic Materials K.K.) for 10 minutes. Subsequently, the resulting test piece was subjected to a dipping treatment with a roughening solution heated at 80° C. (a trade name: CIRCUPOSIT MLB PROMOTER 213, manufactured by Rohm and Haas Electronic Materials K.K.) for 10 minutes. Subsequently, the resulting test piece was subjected to a dipping treatment with a neutralizing solution heated at 45° C. (a trade name: CIRCUPOSIT MLB NEUTRALIZER MLB 216, manufactured by Rohm and Haas Electronic Materials K.K.) for 5 minutes, thereby performing neutralization. In this way, the test piece in which the surface of the interlayer insulating layer was subjected to a roughening treatment was used as the board for surface roughness measurement.

A surface roughness of the thus obtained board for surface roughness measurement was measured with a non-contact type surface roughness meter (a trade name: WYKO NT9100, manufactured by Bruker AXS K.K.) using an internal lens of 1 time and an external lens of 50 times, to obtain an arithmetic average roughness (Ra). The evaluation results are shown in Table 2.

[Measurement Method of Adhesive Strength (Plating Peel Strength) to Plated Copper]

In measuring the adhesive strength to the plated copper, a board for measurement of adhesive strength to the plated copper was prepared according to the following procedures.

First of all, the aforementioned board for surface roughness measurement was cut out into a test piece of 30 mm×40 mm.

The test piece was treated with an alkaline cleaner at 60° C. (a trade name: Cleaner Securiganth 902, manufactured by Atotech Japan K.K.) for 5 minutes, to perform degreasing cleaning. After cleaning, the resultant was treated with a predip liquid at 23° C. (a trade name: Predip Neoganth B, manufactured by Atotech Japan K.K.) for 2 minutes. Thereafter, the resultant was treated with an activator liquid at 40° C. (a trade name: Activator Neoganth 834, manufactured by Atotech Japan K.K.) for 5 minutes, to attach a palladium catalyst thereto. Subsequently, the resultant was treated with a reducer liquid at 30° C. (a trade name: Reducer Neoganth WA, manufactured by Atotech Japan K.K.) for 5 minutes.

The thus treated test piece was put into a chemically copper enriched liquid (a trade name: Basic Printganth MSK-DK, manufactured by Atotech Japan K.K.) and subjected to electroless plating until the thickness of the plating on the interlayer insulating layer became 0.5 μm. After the electroless plating, in order to release a stress remaining in the plated film and remove a residual hydrogen gas, a baking treatment was performed at 120° C. for 15 minutes.

Subsequently, the electroless plated test piece was further subjected to electroplating until the thickness of the plating on the interlayer insulating layer became 30 μm, to form a copper layer as the conductor layer. After the electroplating, the resultant was heated and cured at 190° C. for 120 minutes, to obtain a measurement board before preparation of adhesive strength measurement part.

A resist having a width of 10 mm was formed on the copper layer of the resulting measurement board, and the copper layer was etched with ammonium persulfate, to obtain a board for measurement of adhesive strength to the plated copper, having a copper layer having a width of 10 mm as the adhesive strength measurement part.

Using the thus obtained board for measurement of adhesive strength, the measurement of the adhesive strength between the interlayer insulating layer and the copper layer was performed by the following method.

A load at the time when one end of the copper layer of the adhesive strength measurement part was taken off at an interface between the copper layer and the interlayer insulating layer, grasped by a gripper, and then ripped at room temperature at a tensile rate in the vertical direction of 50 mm/min using a compact table-top tester (a trade name: EZT Test, manufactured by Shimadzu Corporation) was measured. The evaluation results are shown in Table 2.

TABLE 1

| | | | | Example | | | Comparative Example | | |
|---|---|---|---|---|---|---|---|---|---|
| | | | | 1 | 2 | 3 | 1 | 2 | 3 |
| Number of resin film for interlayer insulation | | | | 1 | 2 | 3 | 4 | 5 | 6 |
| Blend composition | Component (A) | Polyimide compound (A) | (mass %) *1 | 80 | 80 | 80 | 100 | 80 | 80 |
| | Component (B) | Modified polybutadiene (B-1) | (mass %) *1 | 20 | | | | | |
| | | Modified polybutadiene (B-2) | (mass %) *1 | | 20 | | | | |
| | | Modified polybutadiene (B-3) | (mass %) *1 | | | 20 | | | |
| | Flexible component | Unmodified polybutadiene | (mass %) *1 | | | | | 20 | |
| | | Modified polyisoprene rubber | (mass %) *1 | | | | | | 20 |
| | Component (C) | Silica filler | (mass %) *2 | 54 | 54 | 54 | 54 | 54 | 54 |
| | Other component | Curing accelerator | (phr) *3 | 0.3 | 0.3 | 0.3 | 0.3 | 0.3 | 0.3 |
| Weight average molecular weight of component (B) or flexible component | | | | 5400 | 12000 | 17000 | — | 7000 | 31000 |
| Number of maleic anhydride group in one molecule of component (B) or flexible component | | | | 2 | 2 | 6 | — | 0 | 3 |
| Evaluation results | Dielectric tangent (5 GHz) | | | 0.0026 | 0.0027 | 0.0036 | 0.0032 | 0.0024 | 0.0030 |
| | Handling properties of film | | | A | A | A | B | A | A |
| | Presence or absence of resin separation | | | No | No | No | No | No | Yes |
| | Presence or absence of gloss unevenness | | | No | No | No | No | Yes | No |

*1: Content (mass %) relative to the mass of all of the resin components contained in the thermosetting resin composition obtained in the Example or Comparative Example
*2: Content (mass %) relative to the total mass exclusive of the organic solvent in the thermosetting resin composition obtained in the Example or Comparative Example
*3: Content (phr) relative to the component (a1) of the raw material as expressed in terms of the amount of the used polyimide compound (A)

The descriptions in Table 1 are as follows.

[Modified Polybutadiene (B)]

(B-1) Ricon 130MA8 (a trade name, manufactured by Cray Valley): Weight average molecular weight: 5,400, number of maleic anhydride group in one molecule: 2

(B-2) Ricon 131MA5 (a trade name, manufactured by Cray Valley): Weight average molecular weight: 12,000, number of maleic anhydride group in one molecule: 2

(B-3) Ricon 184MA6 (a trade name, manufactured by Cray Valley): Weight average molecular weight: 17,000, number of maleic anhydride group in one molecule: 6

[Unmodified Polybutadiene]

Ricon 181 (a trade name, manufactured by Cray Valley): Weight average molecular weight: 7,000, number of maleic anhydride group in one molecule: 0

[Modified Polyisoprene Rubber]

Polyisoprene rubber (a trade name: LIR-403, manufactured by Kuraray Co., Ltd.): Weight average molecular weight: 31,000, number of maleic anhydride group in one molecule: 3

From Table 1 and FIG. 2, in the resin films for interlayer insulation of Examples 1 to 3 using the thermosetting resin composition of the present embodiment, the dielectric tangent was low, the handling properties of film were excellent, and neither resin separation nor gloss unevenness of the resulting interlayer insulating layer was confirmed.

On the other hand, it is noted that the resin films for interlayer insulation of Comparative Examples 1 to 3 are inferior to those of the Examples in any of the characteristics.

That is, it is noted that the resin film for interlayer insulation of the present embodiment obtained using the thermosetting resin composition of the present embodiment is excellent in the handling properties of film; and that the interlayer insulating layer obtained from the resin film for interlayer insulation of the present embodiment is less in the resin separation and gloss unevenness and low in the dielectric tangent.

TABLE 2

|  | Example 4 |
| --- | --- |
| Number of composite film | 1 |
| Surface roughness (Ra) (nm) | 170 |
| Plating peel strength (kgf/cm) | 0.73 |

It is noted from Table 2 that in Example 4 using the composite film of the present embodiment, the interlayer insulating layer that is small in the surface roughness and excellent in the adhesive strength to the plated copper is obtained; and that the composite film of the present embodiment is suitable for the formation of a fine wiring.

Next, the composite film of the present embodiment using the second thermosetting resin composition is more specifically described by reference to the following Examples, but it should be construed that the present invention is by no means limited to these Examples.

Example 5

<Production of Varnish 2 for First Resin Layer>

68.3 parts by mass of an aminosilane coupling agent-treated silica filler (a trade name: SC-2050-KNK, a methyl isobutyl ketone dispersion liquid having a solid content concentration of 70% by mass, manufactured by Admatechs Co., Ltd.) as the inorganic filler (C) and 6.0 parts by mass of a modified polybutadiene (a trade name: Ricon 130MA8, manufactured by Cray Valley, weight average molecular weight: 5,400, number of maleic anhydride group in one molecular chain: 2) as the modified polybutadiene (B) were mixed.

24.1 parts by mass of the polyimide compound (A) produced in Production Example 1 was then mixed therein and dissolved at room temperature by a high-speed rotary mixer.

Thereafter, 1.4 parts by mass of a flame retardant (a trade name: PX-200, manufactured by Daihachi Chemical Industry Co., Ltd.) and an imidazole-based curing accelerator (a trade name: G8009L, manufactured by Dai-ichi Kogyo Seiyaku Co., Ltd.) was mixed in an amount of 0.5 phr relative to the total amount of the component (a1) and the component (a2) as the raw materials as converted from the charged amount of the polyimide compound (A). Thereafter, the mixture was dispersed by a nanomizer treatment, to obtain a varnish 2 for first resin layer.

<Production of Varnish 2 for Second Resin Layer>

42.0 parts by mass of an aralkyl novolak type epoxy resin (a trade name: NC-3000H, manufactured by Nippon Kayaku Co., Ltd., epoxy equivalent: 289 g/mol) as the component (D), 8.8 parts by mass of an inorganic filler (a trade name: AEROSIL R972, manufactured by Nippon Aerosil Co., Ltd., specific surface area: 110±20 $m^2$/g) as the component (H), 0.3 parts by mass of an antioxidant (a trade name: Yoshinox BB, manufactured by API Corporation), and DMAc (manufactured by Godo Co., Ltd.) as a solvent in a solid content concentration of 40% by mass were blended and stirred at room temperature until dissolution of the resin components was confirmed through visual inspection. Thereafter, 6.4 parts by mass as expressed in terms of a solid content of a phenolic hydroxyl group-containing polybutadiene-modified polyamide resin (a trade name: BPAM-155, manufactured by Nippon Kayaku Co., Ltd.) as the component (F), which had been previously dissolved in a solid content concentration of 7% by mass in DMAc, 9.1 parts by mass as expressed in terms of a solid content of a phenoxy resin (a trade name: YX7200, manufactured by Mitsubishi Chemical Corporation, which is a methyl ethyl ketone diluted product (35% by mass)), 32.4 parts by mass as expressed in terms of a solid content of an active ester curing agent (a trade name: HPC-8000-65T (toluene diluted product (65% by mass), manufactured by DIC Corporation) as the component (E), 0.1 parts by mass as expressed in terms of a solid content of a leveling agent (a trade name: BYK-310 (toluene diluted product (25% by mass), manufactured by BYK Japan K.K.), and 0.8 parts by mass of a phosphorus-based curing accelerator (adduct of tri-n-butylphosphine and p-benzoquinone) as the component (G) were blended, and the blend was diluted in a solid content concentration of 20% by mass with DMAc. Thereafter, the mixture was dispersed by a nanomizer treatment, to obtain a varnish 2 for second resin layer.

<Production of Composite Film>

The thus obtained varnish 2 for second resin layer was coated on a release-treated support (PET film, a trade name: CERAPEEL SY(RX) (thickness: 38 μm), manufactured by Toray Advanced Film Co., Ltd.) by using a comma coater such that a thickness of an adhesive auxiliary film after drying was 3 μm, followed by drying at 140° C. for 3 minutes, to form a second resin layer on the support. Subsequently, the varnish 2 for first resin layer was coated on the second resin layer by using a comma coater such that a thickness of the first resin layer after drying was 40 μm, followed by drying at 90° C. for 2 minutes. Subsequently, the resultant was wound up in a roll state while sticking a polypropylene film having a thickness of 15 μm serving as a protective film onto the surface of the first resin layer, to obtain a composite film 2 having a support and a protective film.

<Production of Printed Wiring Board>

The protective film was exfoliated from the thus obtained composite film 2 having a support and a protective film. The resulting composite film having a support was laminated on a printed wiring board having been subjected to a CZ treatment (MCL-E-700GR (a trade name, manufactured by Hitachi Chemical Company, Ltd.) was used as a laminated sheet) such that the first resin layer and the printed wiring board came into contact with each other. The lamination was performed by a method in which after evacuating at 100° C. for 30 seconds, the pressure was applied at 0.5 MPa for 30 seconds, and the resultant was then pressed at 100° C. for 60 seconds under a pressure bonding pressure of 0.5 MPa. The laminate was cooled to room temperature, and the support was exfoliated to obtain a printed wiring board having the composite film disposed therein. Subsequently, the printed wiring board was cured in an explosion-proof dryer at 190° C. for 60 minutes, to obtain a printed wiring board 5A having an interlayer insulating layer formed therein.

Subsequently, in order to chemically roughen the surface of the printed wiring board 5A, an aqueous solution containing 200 mL/L of diethylene glycol monobutyl ether and 5 g/L of NaOH was prepared as a swelling liquid, and the printed wiring board 5A was subjected to a dipping treatment in the foregoing aqueous solution heated at 60° C. Subsequently, an aqueous solution containing 60 g/L of $KMnO_4$ and 40 g/L of NaOH was prepared as a roughening liquid, and the printed wiring board which had been treated with the swelling liquid was subjected to a dipping treatment in the foregoing aqueous solution heated at 80° C. for 5 minutes. Subsequently, an aqueous solution containing 30 g/L of $SnCl_2$ and 300 mL of HCl was prepared as a neutralizing liquid, and the printed wiring board which had been treated with the roughening liquid was subjected to a dipping treatment in the foregoing aqueous solution heated at 40° C. for 5 minutes to reduce $KMnO_4$, thereby obtaining a chemically roughened printed wiring board 5B.

Subsequently, in order to form a circuit layer, the chemically roughened printed wiring board 5B was subjected to a dipping treatment in Activator Neoganth 834 (a trade name, manufactured by Atotech Japan K.K.) that is a $PdCl_2$-containing electroless plating catalyst, at 35° C. for 5 minutes. Subsequently, the resultant was dipped in Printganth MSK-DK (a trade name, manufactured by Atotech Japan K.K.) that is a plating liquid for electroless copper plating, at 30° C. for 20 minutes and further subjected to copper sulfate electrolytic plating. Thereafter, the resultant was subjected to an annealing treatment at 190° C. for 120 minutes, to obtain a printed wiring board 5C having a circuit layer having a thickness of 20 μm.

Example 6

<Production of Varnish 3 for Second Resin Layer>

A varnish 3 for second resin layer was obtained in the same manner as in Example 5, except that in Example 5, the phosphorus-based curing accelerator used for the preparation of the varnish for second resin layer was changed to an adduct of tris(4-methylphenyl)phosphine and p-benzoquinone.

<Production of Composite Film and Printed Wiring Board>

Using the varnish 2 for first resin layer and the varnish 3 for second resin layer, a composite film 3 and printed wiring boards 6A, 6B, and 6C were obtained in the same manner as in Example 5.

[Measurement Method of Dielectric Tangent]

Using the composite films prepared in Examples 5 and 6, resin sheets were prepared in the same manner as in Examples 1 to 3, and their dielectric tangents were measured under the same measurement condition as in Examples 1 to 3. The results are shown in Table 3.

[Measurement Method of Surface Roughness]

The surface roughness of the interlayer insulating layer of each of the printed wiring boards 5B and 6B prepared in Examples 5 and 6, respectively was measured under the same measurement condition as in Example 4. The results are shown in Table 3.

[Measurement Method of Adhesive Strength (Plating Peel Strength) to Plated Copper]

A circuit layer having a width of 1 cm was formed on the conductor layer of each of the printed wiring boards 5C and 6C prepared in Examples 5 and 6, respectively, in the same manner as in Example 4, and the adhesive strength (plating peel strength) to the plated copper was measured under the same measurement condition as in Example 4. The results are shown in Table 3.

[Evaluation of Heat Resistance to 288° C. Solder Flow]

Each of the printed wiring boards 5C and 6C prepared in Examples 5 and 6, respectively was cut in a size of 2 cm×2 cm and floated in a molten solder at 288° C. Thereafter, a time until blister was confirmed through visual inspection was measured. The results are shown in Table 3.

[Observation of Surface Shape after Chemical Roughening]

A surface-roughened shape of each of the printed wiring boards 5B and 6B prepared in Examples 5 and 6, respectively was observed with a scanning electron microscope (a trade name: S-4700, manufactured by Hitachi, Ltd.). As a pretreatment, a sample was subjected to vapor deposition with platinum and then treated at an accelerating voltage of 10 kV and at an inclination angle of 30° under a condition of secondary electron image mode. An SEM photograph of the resulting surface is shown in FIG. 3.

TABLE 3

|  | Example 5 | Example 6 |
|---|---|---|
| Number of composite film | 2 | 3 |
| Dielectric tangent (−) | 0.0028 | 0.0030 |
| Surface roughness (nm) | 123 | 167 |
| Plating peel strength (kN/m) | 0.71 | 0.79 |
| Heat resistance to 288° C. Solder Flow (s) | 315 | 477 |

It is noted from Table 3 that the printed wiring board of each of Examples 5 and 6 using the thermosetting resin composition of the present embodiment has an interlayer insulating layer that is excellent in the heat resistance, small in the dielectric tangent, and excellent in the adhesive strength to the plated copper while having a smooth surface (low surface roughness (Ra)), and is suitable for the formation of a fine wiring. In addition, it is noted from FIG. 3 that the interlayer insulating layer of each of Examples 5 and 6 obtained using the thermosetting resin composition of the present embodiment has a minute and homogenous roughened shape.

INDUSTRIAL APPLICABILITY

The resin film for interlayer insulation and the composite film of the present invention are excellent in handling properties of film. In addition, by using the thermosetting resin composition, the resin film for interlayer insulation, and the composite film of the present invention, an interlayer insulating layer that is low in dielectric tangent and less in resin separation and gloss unevenness can be obtained. In consequence, the thermosetting resin composition, the resin film for interlayer insulation, the composite film, and the printed wiring board of the present invention are useful for electric appliances, such as computers, mobile phones, digital cameras, television receivers, etc., vehicles, such as motorcycles, automobiles, trains, ships, aircrafts, etc., and so on.

REFERENCE SIGNS LIST

1: First resin layer
2: Second resin layer
3: Support
4: Protective film

The invention claimed is:

1. A thermosetting resin composition comprising a polyimide compound (A) having a structural unit derived from a maleimide compound (a1) having at least two N-substituted maleimide groups and a structural unit derived from a diamine compound (a2); a polybutadiene (B) modified with maleic anhydride; and an inorganic filler (C), a total content of the polyimide compound (A) and the polybutadiene (B) being 80% by mass or more based on a total mass of all resin components contained in the thermosetting resin composition.

2. The thermosetting resin composition according to claim 1, wherein a weight average molecular weight of the polybutadiene (B) is from 500 to 25,000.

3. The thermosetting resin composition according to claim 1, wherein the number of a maleic anhydride-derived group included in the polybutadiene (B) is from 1 to 10 in one molecule.

4. The thermosetting resin composition according to claim 1, wherein a weight average molecular weight of the polyimide compound (A) is from 800 to 1,500.

5. The thermosetting resin composition according to claim 1, wherein the inorganic filler (C) is silica.

6. A resin film for interlayer insulation, comprising the thermosetting resin composition according to claim 1.

7. A composite film comprising a first resin layer comprising the thermosetting resin composition according to claim 1; and a second resin layer.

8. The composite film according to claim 7, wherein the second resin layer comprises a second thermosetting resin composition containing a polyfunctional epoxy resin (D), an active ester curing agent (E), and a phenolic hydroxyl group-containing polybutadiene-modified polyimide resin (F).

9. The composite film according to claim 8, wherein an equivalent ratio ((ester group)/(epoxy group)) of an ester group of the active ester curing agent (E) to an epoxy group of the polyfunctional epoxy resin (D) in the second thermosetting resin composition is from 0.3 to 1.5.

10. The composite film according to claim 8, wherein the second thermosetting resin composition further comprises a phosphorus-based curing accelerator (G).

11. The composite film according to claim 7, wherein a dielectric tangent of a cured material at 5 GHz is 0.005 or less.

12. A printed wiring board comprising a cured material of the resin film for interlayer insulation according to claim 6.

13. A method for producing a printed wiring board, comprising a step of laminating the resin film for interlayer insulation according to claim 6.

14. A printed wiring board comprising a cured material of the composite film according to claim 7.

15. A method for producing a printed wiring board, comprising a step of laminating the composite film according to claim 7.

16. The thermosetting resin composition according to claim 1, wherein the number of a maleic anhydride-derived group included in the polybutadiene (B) is from 1 to 5 in one molecule.

17. The thermosetting resin composition according to claim 1, wherein the number of a maleic anhydride-derived group included in the polybutadiene (B) is from 1 to 6 in one molecule.

* * * * *